United States Patent
Inoue et al.

(10) Patent No.: US 8,101,946 B2
(45) Date of Patent: Jan. 24, 2012

(54) LIGHT-EMISSION DEVICE, METHOD OF MANUFACTURING SAME, ELECTRO-OPTICAL DEVICE AND ELECTRONIC DEVICE

(75) Inventors: Satoshi Inoue, Chino (JP); Tatsuya Shimoda, Fujimi-cho (JP); Satoru Miyashita, Chino (JP)

(73) Assignee: Seiko Epson Corporation, Tokyo (JP)

( * ) Notice: Subject to any disclaimer, the term of this patent is extended or adjusted under 35 U.S.C. 154(b) by 109 days.

(21) Appl. No.: 12/453,667

(22) Filed: May 18, 2009

(65) Prior Publication Data
US 2009/0224663 A1    Sep. 10, 2009

Related U.S. Application Data

(60) Division of application No. 11/203,201, filed on Aug. 15, 2005, now Pat. No. 7,550,774, which is a continuation of application No. 10/321,628, filed on Dec. 18, 2002, now abandoned.

(30) Foreign Application Priority Data

Dec. 18, 2001  (JP) ................................. 2001-385179

(51) Int. Cl.
*H01L 35/24* (2006.01)
(52) U.S. Cl. ............... 257/40; 257/83; 257/84; 257/98; 257/184; 257/E51.001
(58) Field of Classification Search ............. 257/83, 257/84, 98, 184, 40
See application file for complete search history.

(56) References Cited

U.S. PATENT DOCUMENTS

| | | | |
|---|---|---|---|
| 5,457,356 | A | 10/1995 | Parodos |
| 5,710,612 | A | 1/1998 | Mase |
| 5,796,509 | A | 8/1998 | Doany et al. |
| 5,998,805 | A * | 12/1999 | Shi et al. .................. 257/40 |
| 6,049,167 | A | 4/2000 | Onitsuka et al. |
| 6,091,194 | A | 7/2000 | Swirbel et al. |
| 6,147,451 | A | 11/2000 | Shibata et al. |
| 6,175,345 | B1 | 1/2001 | Kuribayashi et al. |
| 6,370,019 | B1 | 4/2002 | Matthies et al. |
| 6,373,455 | B1 | 4/2002 | Kuribayashi et al. |
| 6,614,174 | B1 | 9/2003 | Urabe et al. |
| 6,641,933 | B1 | 11/2003 | Yamazaki et al. |
| 2001/0055828 | A1 * | 12/2001 | Kaneko et al. .............. 438/34 |

(Continued)

FOREIGN PATENT DOCUMENTS
EP       1 220 339 A2       7/2002
(Continued)

OTHER PUBLICATIONS

Shimoda et al., "High Resolution Light Emitting Polymer Display Driven by Low Temperature Polysilicon Thin Film Transistor with Integrated Driver," 1998, pp. 217-220, Proc. 18th Int. Display Research Conf., Asia Display.

*Primary Examiner* — Wai Sing Louie
(74) *Attorney, Agent, or Firm* — Oliff & Berridge, PLC

(57) ABSTRACT

An organic EL display unit is manufactured in an efficient manner. A light emission device (1000) is manufactured by bonding together a driving circuit substrate (100) formed with driving circuit constituted by thin film transistors 11, and a light emission substrate (300) comprising a successively laminated transparent electrode layer 31, bank layer 32 made from insulating material, positive hole injection layer 33, organic EL layer 34 and cathode layer 36.

12 Claims, 17 Drawing Sheets

U.S. PATENT DOCUMENTS

| | | |
|---|---|---|
| 2002/0030440 A1 | 3/2002 | Yamazaki |
| 2002/0047567 A1* | 4/2002 | Fujita et al. ............... 315/169.3 |
| 2002/0047568 A1* | 4/2002 | Koyama ..................... 315/169.3 |
| 2002/0125817 A1 | 9/2002 | Yamazaki et al. |

FOREIGN PATENT DOCUMENTS

| | | |
|---|---|---|
| EP | 1 223 618 A2 | 7/2002 |
| JP | A-10-333601 | 12/1998 |
| JP | A-11-003048 | 1/1999 |
| JP | A-11-054268 | 2/1999 |
| JP | A-2000-323276 | 11/2000 |
| JP | A-2001-035663 | 2/2001 |
| JP | A-2001-117509 | 4/2001 |
| JP | A-2001-282123 | 10/2001 |
| JP | A-2002-082633 | 3/2002 |

* cited by examiner

LIGHT-EMISSION DEVICE, METHOD OF MANUFACTURING SAME, ELECTRO-OPTICAL DEVICE AND ELECTRONIC DEVICE

This is a Division of application Ser. No. 11/203,201 filed Aug. 15, 2005, which is in turn a Continuation of application Ser. No. 10/321,628 filed Dec. 18, 2002. The entire disclosures of the prior applications are hereby incorporated by reference herein in their entirety.

TECHNICAL FIELD

The present invention provides a light emission device having extremely high light use efficiency in a structure for a light emission device, and a method for manufacturing same, suitable for an electroluminescence (hereinafter, abbreviated to "EL") display.

BACKGROUND ART

A display unit using organic EL, and in particular, a display unit wherein organic EL layers are driven by circuits constituted by thin film transistors (TFT), is commonly known in the prior art. For example, the paper presented by Shimoda, et. al., (T. Shimoda, H. Ohshima, S. Miyashita, M. Kimura, T. Ozawa, I. Yudasaka, S. Kanbe, H. Kobayashi, R. H. Friend, J. H. Burroughes and C. R. Towns: Proc. 18th Int. Display Research Conf., Asia Display 98, (1998) p. 217), discloses a method wherein a driving circuit using a low-temperature polysilicon (poly-Si) thin-film transistor (TFT) is formed on a glass substrate for each picture element, whereupon a wiring forming step, a transparent electrode forming step, a bank layer forming step, a positive hole injection layer forming step, an organic EL layer forming step, a cathode forming step, and the like, are performed, thereby creating an organic EL display unit.

FIG. 16 and FIG. 17 show the composition of a display unit created according to commonly known technology of this kind. FIG. 17 is a plan view of the organic EL display unit created according to commonly known technology, and FIG. 16 is a sectional view along section B-B (curved section) in the plan diagram shown in FIG. 17. As shown in FIG. 16, a thin film transistor 2, wiring layer 3, transparent electrode 4, bank layer 5, positive hole injection layer 6, organic EL layer 7, and cathode 8 are deposited successively on a glass substrate 1.

Here, since the cathode 8 is formed by a metal which does not transmit light, the light from the organic EL layer 7 is extracted externally from the side of the glass substrate 1 on which the driving circuits are formed. In other words, the face on the side of the driving circuits forms a front surface with respect to the organic EL layer 7. In a display unit of this kind, since the region where the driving circuits are formed does not transmit light, the aperture ratio declines. In other words, as shown in FIG. 17, it is necessary to form an organic EL layer 7 which avoids the region where the thin film transistor 2 and other wires (capacitor 2, wires 3 and 9) are formed. If it is required to increase the performance or added value of the display unit by incorporating various circuitry, such as memory circuits, or the like, into the picture element regions, or if it is attempted to achieve a finely detailed display unit, then since the surface area of the circuit region which does not transmit light becomes relatively large, the aforementioned decline in the aperture ratio becomes a marked problem.

In order to resolve this problem, it is necessary to use a structure wherein driving circuits, or the like, are not present on the side from which the light is emitted, in other words, a structure which uses a transparent electrode material for the cathode or which places the cathode on the driving circuit side.

However, there is a problem involved in using a transparent material for the cathode. This is due to the limitation whereby a material which is close to the work function of the organic EL material used in the organic EL layer must be selected for the electrodes. For example, for the electrode material used in the anode, it is necessary to select a material which is close to the work function of the HOMO level of the organic EL material, and for the electrode material used in the cathode, it is necessary to select a material which is close to the work function of the LUMO level of the organic EL material. However, at the present time, there is no suitable transparent electrode material which is close to the LUMO level of the organic EL material. It has been proposed that the cathode film be formed extremely thinly, but thin electrode layers give rise to faults in terms of durability and current capacity, and are not desirable from the viewpoint of reliability.

On the other hand, in the case of a structure where the cathodes are provided on the driving circuit side, until now, it has been necessary to form an organic EL layer after forming the cathodes, and then to form a positive hole injection layer thereon. In this case, since it is necessary to from the organic EL layer before the positive hole injection layer, there is a risk of lack of uniformity in the thickness of the organic EL layer, and hence unevenness in the amount of light emitted may occur. Moreover, since the material used for the cathode is a material that is liable to oxidization, such as calcium, or the like, then the cathode must be formed with a sealed structure. In view of these circumstances, it is difficult to extract light from the organic EL layer on the opposite side to the driving circuits.

DISCLOSURE OF THE INVENTION

The present invention was devised on the basis of the aforementioned requirements, an object thereof being to provide a light emission device wherein a cathode layer is provided on the driving circuit side of an EL layer.

The light emission device relating to the present invention comprises: a light emission substrate constituted by interposing a light emission layer containing an EL layer in between an optically transmissive anode layer and a cathode layer; and a driving circuit substrate on which driving circuits for driving the light emission layer are formed; the outputs of the driving circuits being electrically connected to the cathode layer, and means for preventing oxidization of the cathode layer being provided between the light emission substrate and the driving circuit substrate.

According to the aforementioned composition, since the cathode layer is connected electrically to the driving circuits, the cathode layer is situated on the driving circuit side with respect to the EL layer. Moreover, since means for preventing oxidization is provided with respect to the cathode layer, damaging of the cathodes can be prevented. Since the anode layer is optically transmissive, light emitted from the light emission layer can be emitted by passing through the anode layer. Since the optical emission efficiency is not affected by the size or configuration of the driving circuits located below the cathode layer, it is possible to increase the aperture ratio of the light emission device.

Here, in the present invention, "optically transmissive" not only refers to a transparent state where virtually 100% of light is transmitted, but also includes states where the light is attenuated to some degree but the light is still transmitted at a level which satisfies practical objectives.

Moreover, "EL (Electroluminescence) layer" refers generally to a layer formed by a light emitting material which emits light on the basis of an electroluminescence effect whereby light is generated by recoupling energy when positive holes injected from an anode recouple with electrons injected from a cathode, due to the application of an electrical field, regardless of whether the light emitting material is organic or inorganic (Zn, S, or the like.) Moreover, in addition to an EL layer made from a light emitting material, the "light emission layer" may also be constituted by either or both a positive hole injection (transportation) layer and/or an electron injection (transportation) layer. More specifically, in addition to a cathode/light emission layer/anode layer structure, it is also possible to adopt layer structures, such as: cathode/light emission layer/positive hole injection layer/anode; cathode/electron injection layer/light emission layer/anode; or cathode/electron injection layer/light emission layer/positive hole injection layer/anode; and the like. It is particularly desirable that a transparent electrode material be used to form the positive hole injection layer.

Moreover, "driving circuit" refers to a circuit constituted in such a manner that it can supply a current for driving a light emission substrate comprising a current-driven EL layer, and such a circuit may be constituted by a thin film transistor, for example. If the light emission device is a magneto-optical device, such as an active matrix type device, then it refers to a group of circuit elements which contribute to the light emission of each respective picture element.

Moreover, "light emission device" does not necessarily require an image display function, and may refer to any device having a light emitting function. For example, this concept also includes illumination devices and indicator devices, and the like.

In the present invention, the light emission layer is superimposed partially or completely over the driving circuits, when viewed from an approximately perpendicular direction to the substrate plane. According to this composition of the present invention, since the light from the light emission layer is emitted via the anode layer side, there is no shielding of the light even if driving circuits are present in such a manner that they overlap with the lower side of the cathode layer as viewed from the light emission layer. Since the light emission efficiency is not affected by the size or positioning of the driving circuits, then the aperture ratio of the light emission device can be increased.

Here, for example, means for preventing oxidization of the cathode layer is constituted by introducing an adhesive which hermetically seals the cathode layer in between the light emission substrate and the driving circuit substrate. By introducing adhesive in this manner, it is possible to shut out oxygen, which is a cause of oxidization of the cathode layer. Moreover, it is also possible to bond the light emission substrate and the driving circuit substrate together more strongly by means of the adhesive force of the adhesive. Since the adhesive material has high insulating properties, there is no adverse effect on the electrical properties.

Here, for example, means for preventing oxidization of the cathode layer is constituted by introducing an inert gas which prevents oxidization of the cathode layer in between the light emission substrate and the driving circuit substrate. By introducing an inert gas, it is possible to prevent oxygen, which is a cause of oxidization of the cathode layer, from acting on the cathode layer. Since it is necessary to introduce and seal the inert gas and to shut out air, desirably, a structure is provided which seals the inert gas hermetically at the end faces, and the like, of the substrates of the light emission device.

Here, for example, the light emission layer comprises, at the least, a positive hole injection layer formed on the anode layer side, and the EL layer formed on the positive hole injection layer. If a positive hole injection layer is used, then during operation, it is possible to raise the light emission efficiency by supplying positive holes from the anode layer, efficiently, to the EL layer. Moreover, in the method of manufacture, since the EL layer is formed after forming the positive hole injection layer, when depositing layers on the anode layer side, it is possible to form an EL layer evenly, to a uniform thickness, due to the presence of the positive hole injection layer. This will help to homogenize the quantity of light emitted and prevent decline in durability due to concentration of the current in a portion of the layer.

Here, for example, the cathode layer comprises an exposure prevention structure which covers the light emission layer and prevents exposure of the end portions of the substrate. By adopting a composition of this kind, it is possible to inject electrons efficiently into the EL layer, and it is also possible to prevent oxidization due to contact of the cathode layer with the air, or the like.

An "exposure prevention structure" refers to a structure which prevents the cathode layer from direct contact with oxygen, and may indicate, for example, a structure in which the cathode layer can be patterned and connected and then surrounded with an adhesive or inert gas. Alternatively, it may include a structure for preventing oxidization by laminating further layers onto the cathode layer.

Here, for example, the driving circuit substrate comprises electrodes which connect to the cathode layer and to which the output of the driving circuit substrate is supplied. By providing electrodes, connection to the cathode layer is achieved easily, and it can be surmised that a driving circuit substrate formed with electrodes of this kind is applied in the present invention.

Here, for example, the electrodes and the cathode layer are electrically connected by means of an electrically conductive material. By means of an electrically conductive material, the contact resistance between the electrodes and the cathode layer is reduced, and moreover, unpredicted shorting, and the like, caused by the occurrence of unwanted electrical connections, or the like, can be prevented.

"Electrically conductive material" means a material having high conductivity which can be used to connect electrodes together, and it is possible to use, for example, an anisotropic conductive paste, or anisotropic conductive film.

The present invention is also an electro-optical device and an electronic device, comprising the light emission device described above.

Here "electro-optical device" refers to a device provided with means for supplying electrical power, or the like, to the aforementioned light emission device, constituted in such a manner that the light emission action can be displayed independently, and hence it covers components for electronic devices, such as irradiation panel, or display panel units, or the like. Moreover, "electronic device" refers generally to a device in which the aforementioned light emission device can be installed and used, and there is no limit on the composition of such a device, examples of which include: a personal computer, digital still camera, liquid crystal television, view finder type or monitor direct view type video tape recorder, car navigation device, page, electronic notebook, calculator, word processor, work station, television telephone, POS terminal, touch panel device, portable telephone, head mounted display, rear or front type projector, fax with display function, or the like.

Moreover, the method of manufacturing a light emission device relating to the present invention comprises the steps of: forming a light emission substrate constituted by interposing a light emission layer containing an EL layer in between an optically transmissive anode layer and a cathode layer; forming a driving circuit substrate on which driving circuits for driving the light emission layer are formed; electrically connecting the outputs of the driving circuits in the driving circuit substrate to the cathode layer in the light emission substrate; and sealing the light emission substrate and the driving circuit substrate together in such a manner that oxidization of the cathode layer is prevented.

According to these processing steps, since the cathode layer is electrically connected to the drive circuits, it is possible to manufacture a light emission device in which the cathode layer is situated on the driver circuit side with respect to the EL layer. Moreover, since means for preventing oxidization is provided with respect to the cathode layer, damaging of the cathodes can be prevented. Since the anode layer is optically transmissive, light emitted from the light emission layer can be emitted by passing through the anode layer. Since the optical emission efficiency is not affected by the size or configuration of the driving circuits located below the cathode layer, it is possible to increase the aperture ratio of the light emission device.

Here, for example, in the step of forming the driving circuit substrate, when the light emission substrate and the driving circuit substrate are connected, a portion or the entirety of the driving circuits in the driving circuit substrate is superimposed with the light emission substrate in the light emission substrate. According to the present invention, since the light from the light emission layer is emitted via the anode layer side, there is no shielding of the light even if driving circuits are present in such a manner that they overlap with the lower side of the cathode layer as viewed from the light emission layer. Therefore, it is possible to position the driving circuits freely and design the circuit configuration freely, with respect to the specifications, without having to take decline of the light emission efficiency into account.

Here, for example, in the sealing step, an adhesive which hermetically seals the cathode layer is filled in between light emission substrate and the driving circuit substrate. By introducing an adhesive, it is possible to shut out oxygen which may cause oxidization of the cathode layer. Moreover, by means of the adhesive force of the adhesive, it is possible to bond the light emission substrate and the driving circuit substrate together more strongly. Since the adhesive has high insulating properties, there is no adverse affect on the electrical properties.

Here, for example, in the sealing step, an inert gas which prevents oxidization of the cathode layer is introduced in between the light emission substrate and the driving circuit substrate. By introducing an inert gas, it is possible to prevent oxygen, which is a cause of oxidization of the cathode layer, from acting on the cathode layer. Since it is necessary to introduce and seal the inert gas and to shut out air, desirably, a structure is provided which seals the inert gas hermetically at the end faces, and the like, of the substrates of the light emission device.

Here, for example, the step of forming the light emission substrate, comprises, at the least, a step of forming a positive hole injection layer on the anode layer side, and a step of forming the EL layer on the positive hole injection layer. According to this manufacturing step, since the EL layer is formed after forming the positive hole injection layer, it is possible to form an EL layer evenly, to a uniform thickness, due to the presence of the positive hole injection layer. This will help to homogenize the quantity of light emitted and prevent decline in durability due to concentration of the current in a portion of the layer. Moreover, if a positive hole injection layer is used, then during operation, it is possible to raise the light emission efficiency by supplying positive holes from the anode layer, efficiently, to the EL layer.

Here, for example, in the step of forming the light emission substrate, the cathode layer is formed in an exposure preventing shape which covers the light emission layer and prevents exposure of the end portions of the substrate. By forming in a shape of this kind, it is possible to inject electrons efficiently into the EL layer, and it is also possible to prevent oxidization due to contact of the cathode layer with the air, or the like.

Here, for example, in the step of forming the driving circuit substrate, electrodes are formed, which connect to the cathode layer and to which the output of the driving circuit substrate is supplied. By forming electrodes, connection to the cathode layer is achieved easily, and it can be surmised that a driving circuit substrate formed with electrodes of this kind is applied in the present invention.

Here, for example, in the step of connecting the light emission substrate and the driving circuit substrate, the electrodes and the cathode layer are electrically connected by means of an electrically conductive material. By means of an electrically conductive material, the contact resistance between the electrodes and the cathode layer is reduced, and moreover, unpredicted shorting, and the like, caused by the occurrence of unwanted electrical connections, or the like, can be prevented.

The light emission device (organic EL display unit) according to the present invention is a display unit using organic EL elements in a display section, formed by respectively preparing a driving circuit substrate incorporating driving circuits for the organic EL elements, and an EL substrate incorporating the organic EL elements, and bonding the substrates together.

Thereby, the face on which the EL elements are provided, with respect to the driving circuits, forms the display face, and hence various circuits, such as memory circuits, can be incorporated into the picture element regions, thereby improving the performance and added value of the display unit, and making it possible to achieve a finely detailed display unit.

In the light emission unit described above, it is possible to form contact electrodes respectively on the surfaces of the driving circuit substrate and the EL substrate which are to be bonded together, in such a manner that these electrodes contact each other.

Moreover, in the light emission device described above, it is also possible for the contact electrodes on the EL substrate to be connected to the cathodes or the cathodes of the EL.

Furthermore, in the light emission device described above, it is also possible for the surface of the display unit to be taken as the EL substrate side.

Moreover, in the light emission device described above, it is also possible for the EL substrate to comprise a common anode layer made from a transparent material, and a hole transportation layer, light emission layer, and cathode pattern formed thereon in accordance with each picture element.

Furthermore, in the light emission device described above, it is also possible for the driving circuits on the driving circuit substrate to be constituted by thin film transistors formed on a glass substrate.

Moreover, in the light emission device described above, it is also possible for the driving circuits on the driving circuit substrate to be constituted by thin film transistors formed on a flexible substrate.

Furthermore, in the light emission device described above, it is also possible for the driving circuit substrate to be formed by transferring driving circuits constituted by thin film transistors formed on another substrate.

Moreover, in the light emission device described above, it is also possible for the driving circuit substrate to be formed by transferring driving circuits constituted by thin film transistors formed on another substrate, for each picture element or each plurality of picture elements.

Furthermore, in the light emission device described above, it is also possible for the driving circuit substrate to be formed by transferring driving circuits constituted by thin film transistors formed on another substrate, onto a flexible substrate. By means of this composition, it is possible to fabricate a display unit by transferring driving circuits by means of transfer technology, without wasting semiconductor material.

Moreover, in the light emission device described above, it is also possible for the EL substrate to be formed on a glass substrate.

Furthermore, in the light emission device described above, it is also possible for the EL substrate to be formed on a flexible substrate.

Moreover, in the light emission device described above, it is also possible for the bonding of the driving circuit substrate and the EL substrate to be performed by interposing an anisotropic conductive paste or anisotropic conductive film therebetween.

Furthermore, in the light emission device described above, it is also possible for the EL substrate to be formed by layering a common transparent electrode layer on a substrate surface, for each picture element, and then layering a light emission layer containing an organic EL layer, and a cathode layer, on top of the transparent electrode layer, at positions corresponding to the respective picture elements.

In the method of manufacturing a light emission device according to the present invention, a driving circuit substrate incorporating driving circuits for organic EL elements, and an EL substrate incorporating the organic EL elements, are bonded together.

According to this method of manufacture, it is possible to manufacture a large scale display unit or a flexible display unit.

In the method of manufacturing a light emission device described above, it is possible to form contact electrodes respectively on the surfaces of the driving circuit substrate and the EL substrate which are to be bonded together, in such a manner that these electrodes contact each other.

Moreover, in the method of manufacturing a light emission device described above, it is also possible for the contact electrodes on the EL substrate to be connected to the cathodes or the cathodes of the EL.

Furthermore, the method of manufacture described above is characterized in that the surface of the display unit is taken as the EL substrate side.

Moreover, in the method of manufacturing a light emission device described above, it is also possible for the EL substrate to comprise a common anode layer made from a transparent material, and a hole transportation layer, light emission layer, and cathode pattern formed thereon in accordance with each picture element.

Furthermore, in the method of manufacturing a light emission device described above, it is also possible for the driving circuits on the driving circuit substrate to be constituted by thin film transistors formed on a glass substrate.

Moreover, in the method of manufacturing a light emission device described above, it is also possible for the driving circuits to be constituted by thin film transistors formed on a flexible substrate.

Furthermore, in the method of manufacturing a light emission device described above, it is also possible for the driving circuit substrate to be formed by transferring driving circuits constituted by thin film transistors formed on another substrate.

Moreover, in the method of manufacturing a light emission device described above, it is also possible for the driving circuit substrate to be formed by transferring driving circuits constituted by thin film transistors formed on another substrate, for each picture element or each plurality of picture elements.

Furthermore, it is also possible for the driving circuit substrate to be formed by transferring driving circuits constituted by thin film transistors formed on another substrate, onto a flexible substrate.

Moreover, it is also possible for the EL substrate to be formed on a glass substrate.

Furthermore, it is also possible for the EL substrate to be formed on a flexible substrate.

Moreover, it is also possible for the bonding of the driving circuit substrate and the EL substrate to be performed by interposing an anisotropic conductive paste or anisotropic conductive film therebetween. The anisotropic conductive paste and anisotropic conductive film are commonly known devices, being a paste or a film which can be used as an adhesive, and if interposed thinly as an adhesive between two members, it demonstrates low electrical resistance in the direction of the thickness of the film, and demonstrates high electrical resistance in the direction parallel to the surface of the film.

Furthermore, it is also possible for the EL substrate to be formed by layering a common transparent electrode layer on a substrate surface, for each picture element, and then layering a light emission layer containing an organic EL layer, and a cathode layer, on top of the transparent electrode layer, at positions corresponding to the respective picture elements.

BEST MODE FOR CARRYING OUT THE INVENTION

Below, preferred embodiments of the present invention are described with reference to the drawings.

First Embodiment (Manufacturing Light Emission Device)

Figure 1:
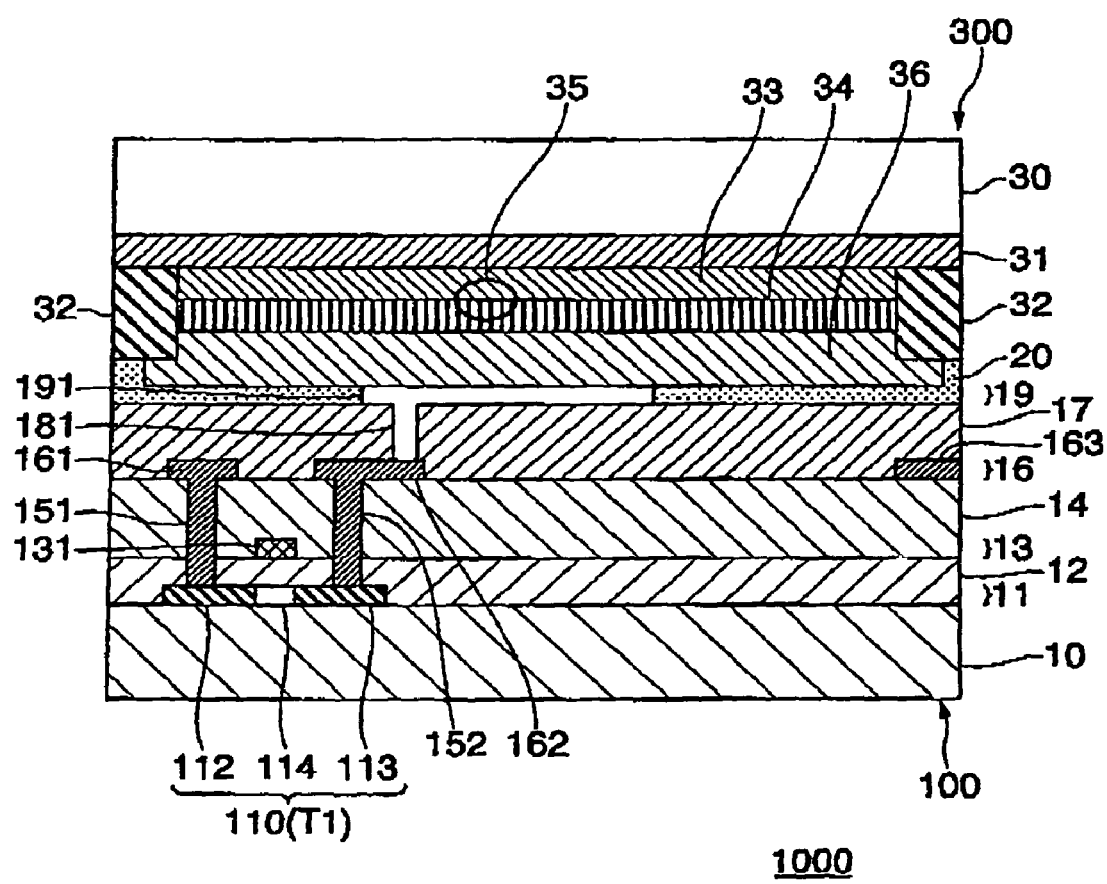
FIG. 1 is a sectional view of a light emission device relating to a first embodiment of a light emission device according to the present invention (a sectional view along A-A in FIG. 2)
Figure 2:
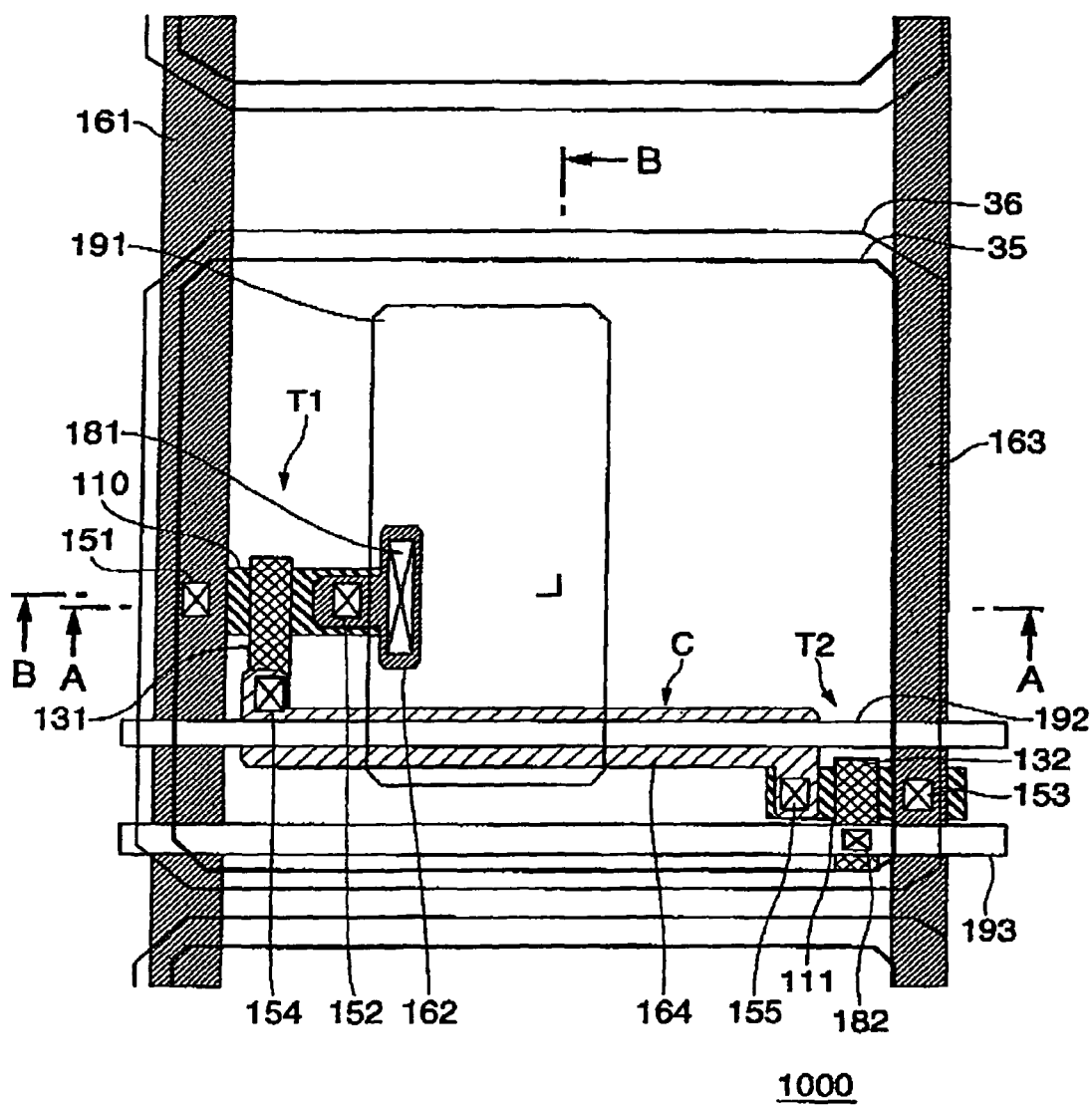
FIG. 2 is a plan view of a light emission device relating to the first embodiment.

FIG. 1 shows a sectional view of a light emission device 1000 according to a first embodiment of the present invention. FIG. 2 shows a plan view of a light emission device 1000 according to this first embodiment. FIG. 1 is a sectional view taken along section A-A in the plan view in FIG. 2.

The light emission device 1000 of the first embodiment is an organic EL display unit used for displaying images, and comprises a driving circuit substrate 100 side structure and a light emission (EL) substrate 300 side structure.

As shown in FIG. 1, the layer structure of the driving circuit substrate 100 is constituted, respectively from the lower side upwards, by laminating a substrate 10, a semiconductor thin film 11 (source 112, drain 113, channel 114), a gate insulating film 12, a gate electrode layer 13, a first protective thin film 14, a wiring layer 16, a second protective thin film 17, and a picture element electrode layer 19.

The layer structure of the light emission substrate 300, on the other hand, is constituted respectively, from the upper side downwards, (from the top down in the diagram: this forming the lower layer side during manufacturing), by laminating a transparent substrate 30, a transparent electrode layer 31, a positive hole injection layer 33 inside a picture element forming region delimited by a bank 32, an organic EL layer 34 and a cathode layer 36. A light emission layer 35 is formed by the positive hole injection layer 33 and the organic EL layer 34.

Figure 6:
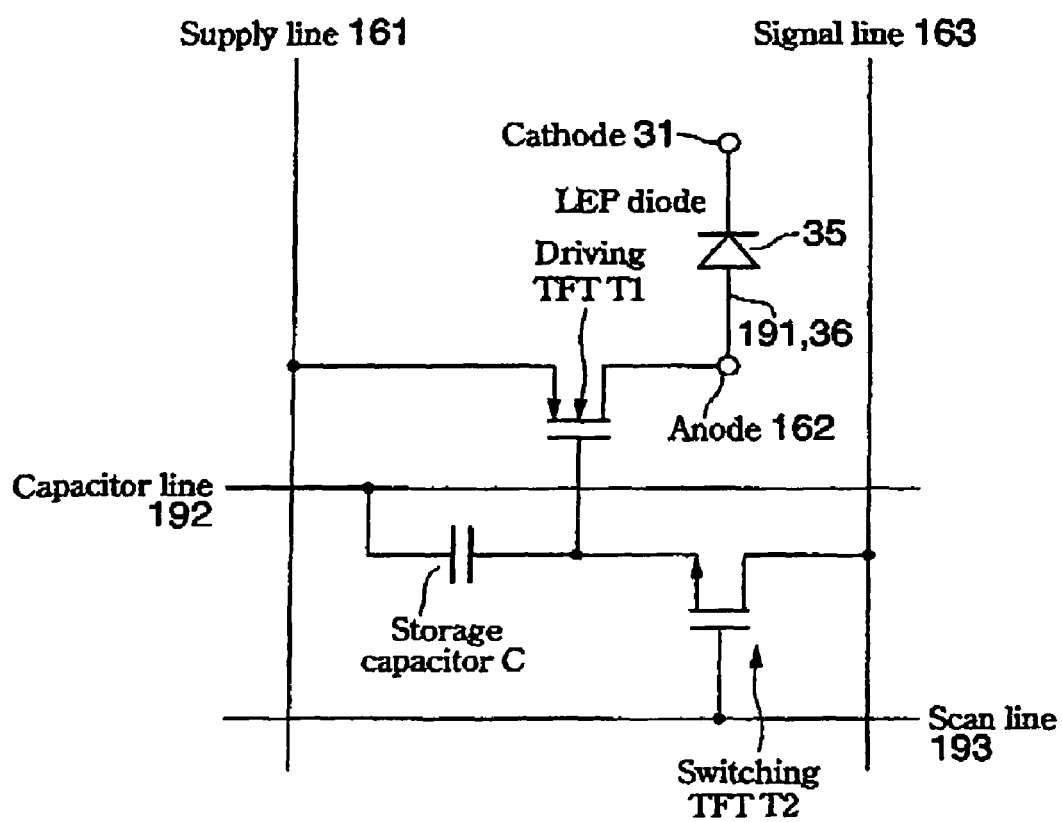
FIG. 6 is a circuit diagram of an electro-optical device relating to a first embodiment of the present invention.

More specifically, a driving circuit and picture element region are disposed as illustrated in the plan diagram shown in FIG. 2. FIG. 6 shows a circuit diagram of the light emission device 1000 corresponding to this arrangement. As FIG. 2 and FIG. 6 reveal, in this light emission device, a supply line 161 for supplying electric power and a signal line 163 for supplying write information, and a scan line 193 for supplying a scan signal and a capacitor line 192 for connecting a storage capacitor C are provided in each picture element region, in intersecting regions.

The semiconductor thin film 11 is patterned into a thin film 110 relating to a driving thin film transistor (driving TFT) T1, and thin film 111 relating to a switching thin film transistor (switching TFT) T2. The gate electrode layer 13 is patterned into a gate electrode 131 relating to the thin film transistor T1, and a gate electrode 132 relating to the thin film transistor T2. Moreover, the wiring layer 16 is patterned into a supply line 161, drain electrode 162, signal line 163, and storage capacitor 164. The picture element electrode layer 19 is patterned into a picture element electrode 191, capacitor line 192 and scan line 193.

Moreover, the source 112 of the semiconductor thin film 110 constituting the driving thin film transistor T1 is connected via a through hole 151 to the supply line 161. The drain 113 of the thin film transistor T1 is connected via a through hole 152 to the drain electrode 162. The drain electrode 162 is connected to the picture element electrode 191 via a through hole 181. On the other hand, the gate electrode 131 of the thin film transistor T1 is connected via a through hole 154 to the storage capacitor C, and is also connected via a through hole 155 to the source 112 of the semiconductor thin film 111 constituting the switching thin film transistor T2. The storage capacitor C accumulates electric charge in conjunction with the capacitor line 192, in such a manner that the current required to drive the light emission layer 35 is fixed with respect to the voltage held at either end of the storage capacitor C. Moreover, the drain 113 of the thin film transistor T2 is connected to the signal line 163 via the through hole 153. The gate electrode 132 of the thin film transistor T2 is connected via the through hole 156 to the scan line 193.

As indicated by FIG. 1 and FIG. 6, according to the foregoing composition, whenever the scan line 193 assumes an on state at each scan timing in the driving circuit substrate 100, the switching thin film transistor T2 switches on and the voltage supplied to the signal line 163 is stored in the storage capacitor C. Thereupon, a current corresponding to this voltage is caused to flow through the driving thin film transistor T1, and this current flows from the cathode side of the organic EL element, in other words, from the cathode layer 31, into the light emission layer 35, in other words, the positive hole injection layer 33 and organic EL layer 34, thereby causing a quantity of light corresponding to the amount of current to be emitted. Namely, the organic EL element emits light of a quantity corresponding to the voltage designated by the signal line 163.

In particular, in the present invention, the light emitted from the light emission layer 35 is emitted from the substrate 30 via the anode layer 31 which is optically transmissive, rather than being emitted on the cathode layer 36. Therefore, light emission is not affected, even if members which do not transmit light are provided to the rear of the cathode layer 36, from the viewpoint of the light emission layer 35, in other words, even if driving circuits are present to the rear of the cathode layer 36. Therefore, in the present embodiment, it is possible to position the thin film transistors T1 and T2, the storage capacitor C, and the wiring layers 161-164, 191-193, in such a manner that they overlap partially or fully with the light emission layer 35 in plan view, as illustrated by the plan diagram shown in FIG. 2, for example.

(Method of Manufacturing Driving Circuit)

Figure 7:
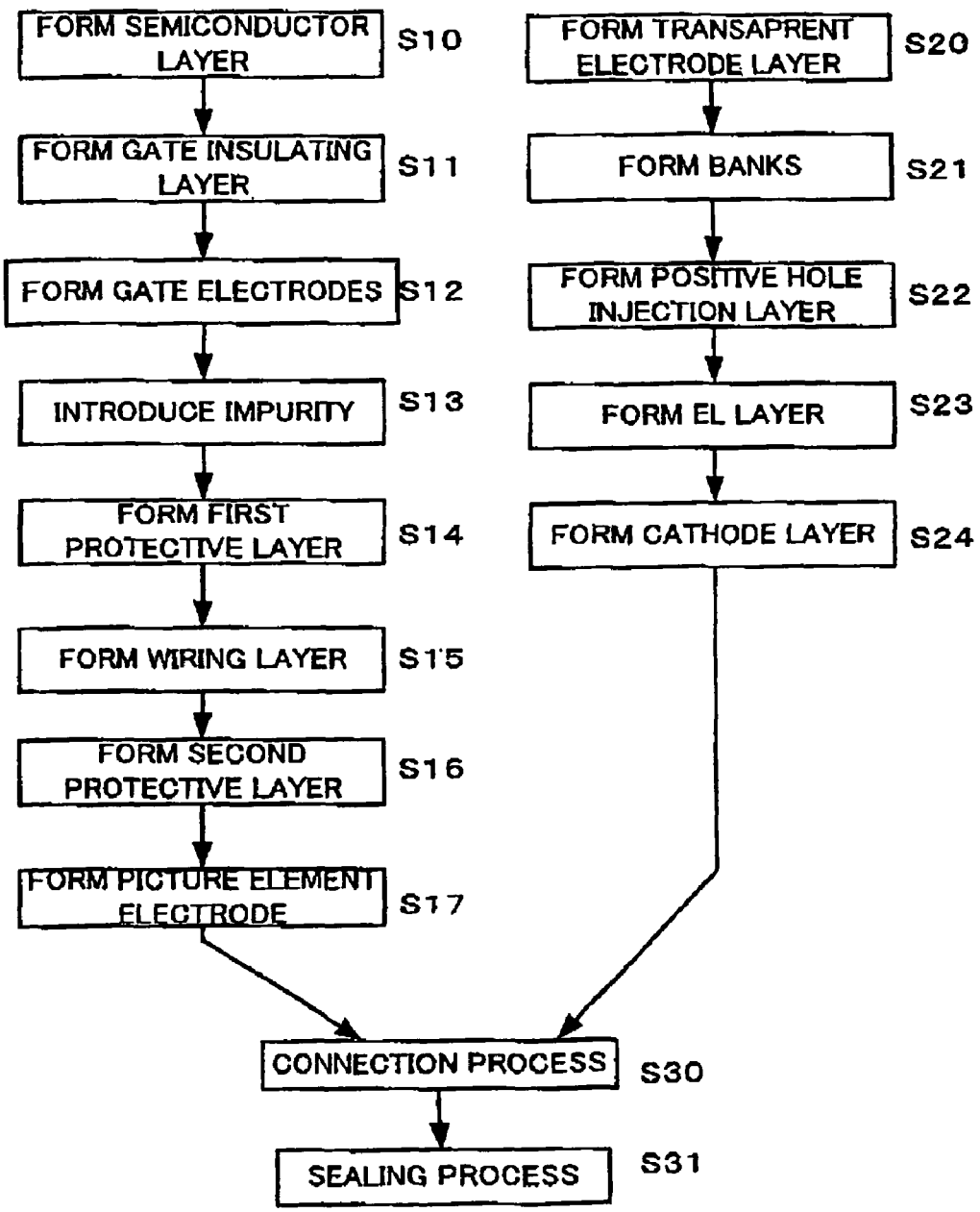
FIG. 7 is a manufacturing process diagram showing an example of a method of manufacturing a light emission device relating to the first embodiment.

Next, a method of manufacturing the present light emission device is described with reference to the manufacturing process flowchart in FIG. 7. As shown in FIG. 7, this manufacturing method comprises steps for forming a driving circuit substrate 100 (S10-S17), steps for forming a light emission substrate 300 (S20-24), and steps for fabricating a light emission device 1000 using these two substrates (S30, S31).

The processes of forming the driving circuit substrate and forming the light emission substrate may be performed independently, in different factories, for example, or they may be performed successively in the same manufacturing plant (for example, by first forming the driving circuit substrate and then forming the light emission substrate, or vice versa). Moreover, the process for manufacturing the light emission device 1000 may be performed in the same site as that in which the drive circuit substrate or light emission substrate is formed, or it may be performed in a different site. Here, the procedure is described in order, starting from the formation of the driving circuit substrate.

It is possible to adopt various commonly know manufacturing techniques for manufacturing the driving circuit substrate 100. Some examples of such techniques are given below. Firstly, a semiconductor thin film 11 (110, 111) is formed on a substrate 10 which forms the basis of the driving circuit substrate 100 (S10). In the present invention, since it is not necessary to use an optical transparent material on the driving circuit substrate side, a substrate material can be selected according to its durability, and mechanical strength, or the like. For example, for the substrate 10, it is possible to use a conductive material, such as metal, a ceramic material, such as silicon carbide, alumina, aluminium nitride, or the like, a transparent or semi-transparent insulating material, such as fused silica, glass, or the like, a semiconductor material, such as a silicon wafer, or an LSI substrate formed from a processed silicon wafer, or the like.

If a driving circuit substrate is fabricated using transfer technology developed by the present applicants (for example, that disclosed in Japanese Patent Laid-open No. (Hei) 10-125931 and Japanese Patent Laid-open No. (Hei) 11-26733) to transfer a semiconductor device previously formed separately on a glass substrate, or the like, onto a flexible substrate, then a flexible substrate 10 is formed. This is described in more detail in a second embodiment.

Materials such as silicon, germanium, silicon-germanium, silicon carbide, germanium carbide, or the like, may be used for the semiconductor thin film 11. This semiconductor thin film 11 is formed by a CVD technique, such as APCVD, LPCVD, or PECVD, by sputtering, or the like, or by a PVD technique such as vapour deposition, or the like. In order to improve the properties of the semiconductor thin film 11, it is also possible to achieve a multi-crystalline structure in the semiconductor thin film, using a high-output laser, such as an excimer laser. The semiconductor thin film 11 is formed by patterning by photolithography, or the like, to form respective thin film transistor shapes, and then etching by dry etching, or the like.

Next, a gate insulating film 12 is formed (S11). The gate insulating film 12 is formed to a prescribed thickness by depositing SiO2 by means of a commonly known method, such as ECR plasma CVD, parallel planar RF discharge plasma CVD, or the like.

Thereupon, the gate electrode layer 13 (131, 132) is formed (S12). Firstly, a metal thin film for forming the gate electrode is deposited on the gate insulating film 12 by means of a PVD technique, CVD technique, or the like. Desirably, the material of the gate electrode layer has a low electrical resistance and is stable with respect to heat treatment, and high-melting-point metals, such as tantalum, tungsten, chromium, or the like, are suitable in these respects. Moreover, when forming the source and drain by ion doping, the film thickness of the gate electrode is required to be approximately 700 nm, in order to prevent hydrogen channelling. After forming the gate electrode layer 13, it is patterned into the shapes of gate electrodes 131, 132, using a commonly known photolithography method and etching method.

Thereupon, respective regions for a source 112, drain 113, and channel 114 are formed by introducing an impurity into the semiconductor thin film 11 (S13). In this impurity introduction, since the gate electrodes 131, 132 form masks for the ion injection, the channel has a self-regulating structure whereby it is formed only under the gate electrode. For example, if the thin film transistor is an n-type MOS transistor, then the channel 114 is doped with a p-type impurity, such as boron, gallium, indium, or the like, and the source 112 and drain 113 are injected with an n-type impurity, such as phosphorous, arsenic, antimony, or the like.

Thereupon, a first protective thin film 14 is formed so as to cover the gate electrode (S14). The first protective thin film 14 is formed in a similar manner to the gate insulating film.

Next, a wiring layer 16 (161-164) is formed (S15). Prior to this, a through hole 15 (151-155) for electrically connecting the wiring layer 16 with the semiconductor thin film 11 and gate electrode 13 is opened in the gate insulating film 12 and the first protective thin film 14. A wiring layer 16 is then formed from a metal, such as aluminium, or the like, using a commonly known techniques, such as PVD, CVD, or the like, and is patterned into respective wiring shapes, to form a supply line 161, drain electrode 162, signal line 163, and capacitor electrode 164.

Thereupon, a second protective thin film 16 is formed similarly to the first protective thin film 14 (S16), and a through hole 18 (181, 182) is opened in the wiring layer 19 (191-193) to connect electrically to the underlying drain electrode 162 and the scan line 193. The second wiring layer 19 is formed using a commonly known technique, such as PVD, CVD, or the like, and is patterned to form the shapes of a picture element electrode 191, capacitor line 192 and scan line 193 (S17). The wiring layer 19 and picture element electrode layer 19 are formed by depositing a conductive metal material, such as aluminium lithium (Al—Li) to a thickness of 0.1 μm-1.0 μm. By means of the various processing steps described above, a driving circuit substrate 100 is formed.

Figure 3:
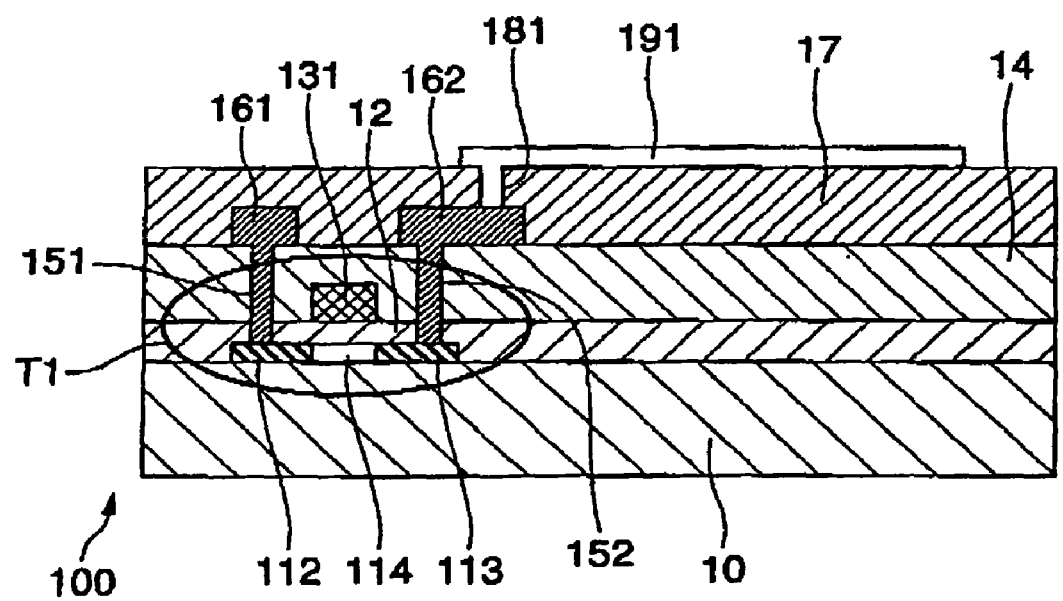
FIG. 3 is a sectional view of a driving circuit substrate prior to a bonding step.

FIG. 3 shows the layer structure of a driving circuit substrate 100 manufactured in the aforementioned manner. FIG. 3 is a sectional view along the curved cross section B-B in the plan view in FIG. 2.

(Method for Manufacturing Light Emission Substrate)

In the next place, the method for manufacturing a light emission substrate 300 is described with reference to FIG. 7, the flow chart of manufacturing processes. It is possible to adopt various commonly known manufacturing techniques for manufacturing the light emission substrate 300. Some examples of such techniques are given below.

Firstly, a transparent electrode layer 31 is formed on a transparent substrate 30 (S20). In the present invention, since the light from the light emission layer is emitted by passing through this substrate 30, it is fundamental that this substrate 30 be optically transmissive, in addition to which a suitable material is selected by taking account of durability, mechanical strength, and other factors, as well. For example, a transparent or semi-transparent insulating material, such as fused silica, glass, or the like, can be used. The transparent electrode layer 31 is made from a material which is electrically conductive and optically transmissive, and is close to the work function of the HOMO level of the organic EL material used in the EL layer 34, for example, ITO, NESA, or the like. The transparent electrode layer 31 is formed commonly across the full range of the light emission layer 35 provided for each picture element, so as to form a common electrode for each picture element region. The forming method may use a common coating technique, sputtering method, or the like, the layer being adjusted to a thickness of 0.05 µm-0.2 µm.

Thereupon, a bank layer 32 is formed on the transparent electrode layer 31. This bank layer serves to provide dividing members which separate the light emission layer 35 and the cathode layer 36 in the respective picture elements. The material of the bank layer 32 is formed by an insulating inorganic compound or an insulating organic compound. For example, materials such as silicon oxide, silicon nitride, amorphous silicon, polysilicon, polyimide, or fluorine compounds, or the like, may be used. For instance, the affinity of the bank layer 32 is adjusted in such a manner that the contact angle with respect to the thin film material for forming the positive hole injection layer 33 and EL layer 34, and the like, is 30 degrees or below. The thickness of the bank layer 32 is thicker than the total thickness after formation of the positive hole injection layer 33 and the EL layer 34, and the thickness after formation of the cathode layer 36 is adjusted so as to be lower than this total thickness. The bank layer 32 is formed by depositing the aforementioned insulating compound, by a commonly known technique, such as sputtering, CVD, coating techniques (spin coating, spray coating, roll coating, dye coating, dip coating), or the like, and then removing the compound to leave bank regions by means of photolithography, or the like.

Thereupon, the positive hole injection layer 33 is formed (S22). As a material for this positive hole injection layer 33, an organic material or inorganic material having a positive hole injection function or an electrode barrier function is used. For example, the material disclosed in Japanese Patent Laid-open No. (Hei) 10-163967 and Japanese Patent Laid-open No. (Hei) 8-248276.

Various commonly known methods can be used for forming the positive hole injection layer 33 and the subsequent EL layer 34, but desirably, an ink jet method is employed. Therefore, in order to form these layers in the recess sections demarcated by the bank layer 32, liquid thin film material is successively filled into said sections to form thin film layers. Using an ink jet method, it is possible to fill a desired quantity of a fluid material into a desired position, and such a filling operation can be performed using a small scale device such as that employed in a domestic printer. For example, the liquid thin film material is filled from the ink jet head into the recess sections formed by the bank layer 32, and is then heated to remove the solvent components. The ink jet method used may be a piezo jet method, or a method which expels material due to vaporization caused by heating, or it may be an electrostatic pressurization method. A piezo jet method is desirable, since it does not involve modification of the fluid material due to heating.

The EL layer 34 is formed by a similar method, after the positive hole injection layer 33 has been formed (S23). A material which emits light when a current flows therein is used. The material used is that described in Japanese Patent Laid-open No. (Hei) 10-163967, or Japanese Patent Laid-open No. (Hei) 8-248276, for instance, depending on the colour of light that is to be emitted. More specifically, for a red coloured EL layer material, a material such as a cyano-polyphenylyne vinylene precursor, 2-1,3',4'-dihydroxy-phenyl-3, 5,7-trihydroxy-1-benzopyrylium perchlorate, PVK doped with DCM1, or the like.

As a material for a green coloured EL layer, it is possible to use a polyphenylyne precursor, 2,3,6,7-tetrahydro-11-oxo-1H,5H,11H-(1) benzopyrano-[6,7,8-ij]-quinolizine-10-carbonate, PVK doped with quartamin 6, or the like. As a material for a blue colour EL layer, it is possible to use an aluminium quinolinol complex, a pyrazoline dimer, 2,3,6,7-tetrahydro-9-methyl-11-oxo-1H,5H,11H-(1)-benzopyrano [6,7,8-ij]-quinolizine, a diester derivative, PVK doped with 1,1,4,4-triphenyl-1,3-butadiene, or the like. The EL layer 34 is layered to a thickness for obtaining a suitable light quantity, for example, approximately 0.05 µm-0.2 µm.

It is also possible to form an electron injection layer on top of the EL layer, by a similar method, according to requirements. This is in order to transmit electrons injected from the cathode layer, efficiently, to the light emission layer. As a material for the electron injection layer, it is possible to use a material such as that described in Japanese Patent Laid-open No. (Hei) 10-163967, or Japanese Patent Laid-open No. (Hei) 8-248276, or Japanese Patent Laid-open No. (Sho) 59-194393. More specifically, it is possible to use a nitro-substituted fluorine derivative, an anthraquinone dimethane derivative, a diphenyl quinone derivative, a thiopyran dioxide derivative, a complex ring tetracarbonate anhydride, such as naphthalene perylene, or the like, a carbodiimide, fluo-renylidene methane derivative, an anthraquino-dimethane and anthrone derivative, an oxadiazole derivative, quinoxaline derivative, and the like. The thickness thereof is set to a dimension whereby a sufficient electron transportation function is displayed.

Figure 4:
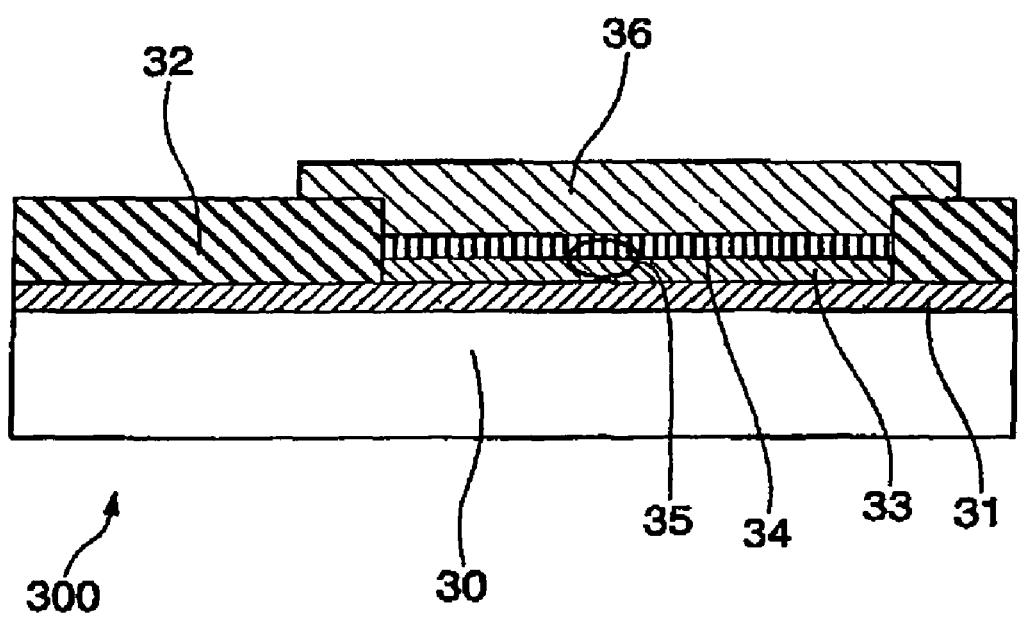
FIG. 4 is a sectional view of a light emission substrate prior to a bonding step.

Thereupon, a cathode layer 36 is formed (S24). According to the present invention, since optical transmissivity must be taken into account in the cathode layer, a material should be used which has a work function that is close to the LUMO level of the organic EL material used in the light emission layer. For example, for this material, it is possible to use calcium, sodium, a sodium-potassium alloy, magnesium, lithium, a magnesium-copper compound, a magnesium-sliver compound, a magnesium-aluminium compound, a magnesium-indium compound, an aluminium-aluminium oxide compound, indium, a lithium-aluminium compound, or other rare-earth metals. A common technique, such as sputtering, vapour deposition, or the like, is used in forming the cathode layer. After forming the cathode layer, it is separated for each respective picture element region, by photolithography and etching, or the like. In this case, desirably, it is formed so as to cover the edges of the bank layer 32, as illustrated in FIG. 1 and FIG. 4. This is because it makes it possible to contact the light emission layer 35 without any gap therebetween.

FIG. 4 shows the layer structure of a light emission substrate 300 formed in this manner. FIG. 4 is a sectional view along the curved cross section B-B of the plan view in FIG. 2. As shown in FIG. 4, a transparent electrode layer 31 is deposited onto the whole surface of the transparent substrate 30, and a positive hole injection layer 33, EL layer 34 and cathode layer 36 are layered subsequently on top of the transparent electrode layer 31, from the side of the transparent electrode layer 31, in the picture element forming regions mutually separated by the banks 32 made from insulating material, a light emission layer 35 being constituted by each positive hole injection layer 33 and organic EL layer 34.

(Subsequent Processing: S30)

Next, the driving circuit substrate 100 illustrated in FIG. 3 and the light emission substrate 300 illustrated in FIG. 4 are aligned together in such a manner that the side on which the picture element electrodes 191 are formed and the side on which the cathode layers 36 are formed are mutually opposing. The driving circuit substrate 100 and light emission substrate 300 are registered in position in such a manner that the picture element electrodes 191 and cathode layers 36 are electrically connected. In this case, in order to ensure conductivity between the picture element electrodes 191 on the driving circuit substrate 100 and the cathode layers 36 on the light emission substrate 300, desirably, an anisotropic conductive paste or anisotropic conductive film is used. By using a conductive material of this kind, it is possible to avoid shorting, and the like, in advance. According to the present embodiment, since each picture element electrode 191 and cathode layer 36 is formed so as to project outwards in a relative fashion, if the positional registration is performed correctly, then the respective electrodes are pressed together and reliable electrical connection can be ensured.

Figure 5:
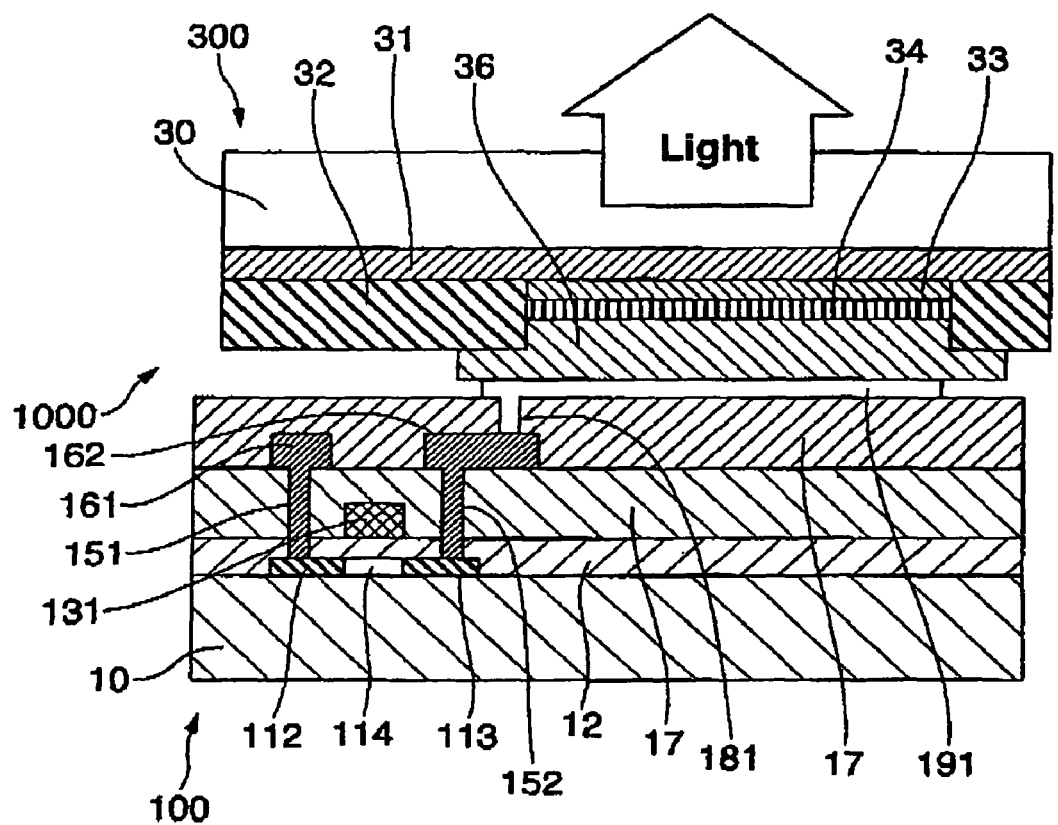
FIG. 5 is a sectional view of a light emission device after a bonding step.

FIG. 5 shows a sectional view of the entirety of a light emission device 1000 in a state where the driving circuit substrate 100 and the light emission substrate 300 have been bonded together in the aforementioned manner. FIG. 5 is a sectional view along the curved cross section B-B in the plan view in FIG. 2.

(Sealing Process: S31)

Thereupon, the substrates are sealed together by filling in a filling material which has no electrical conductivity and is inert with respect to the cathode material, in between the electrically connected driving circuit substrate 100 and light emission substrate 300.

For this material 20, it is suitable to use, for example, a variety of adhesives. Examples of such adhesives include setting adhesives of various types, such as reactive hardening adhesives, thermosetting adhesives, air-setting adhesives, or the like. The composition of this adhesive may be, for example, based on an epoxy, acrylate or silicon base, or the like. The adhesive is formed by a coating method, or the like. Since neither the cathode layer nor the driving circuit substrate transmit light, it is desirable to use an adhesive which hardens on the basis of a type of energy other than light. For example, a suitable amount of adhesive is coated onto the regions other than the picture element electrodes 191 of the driving circuit substrate 100, and the whole of the light emission substrate 300 is bonded to the driving circuit substrate 100 whilst maintaining electrical contact between the picture element electrodes 191 and cathode layers 36 of the light emission substrate 300, whereupon the setting adhesive is caused to harden by a setting method corresponding to the characteristics of that adhesive.

It is possible to shut out oxygen which can cause oxidization of the cathode layer, by filling in adhesive in this manner. Moreover, it is also possible to bond the light emission substrate and the driving circuit substrate together more tightly by means of the adhesive force of the adhesive. Since the adhesive also has high insulating properties, there is no adverse effect on the electrical properties.

It is also possible to seal the driving circuit substrate 100 and the light emission substrate 300 together by filling an inert gas therein, rather than using an adhesive. Helium, argon, or the like, may be used as an inert gas. However, since oxygen should be prevented from acting on the cathode layer, it is also possible to increase the degree of vacuum between the driving circuit substrate and the light emission substrate. When a gas is used or a vacuum is created, it is necessary to adopt a structure which seals the ends of the substrate in order to increase the sealing characteristics between the substrates. If an inert gas is introduced, or a vacuum is created, it is possible to prevent oxygen which may cause oxidization of the cathode layer from acting on the cathode layer.

As illustrated in FIG. 5, in the light emission device 1000 manufactured by the aforementioned manufacturing steps, when the driving circuit is operated and a current is introduced into the light emission layer 35 from the cathode layer 36, the light emission layer 35 emits light of a quantity corresponding to the amount of current. In this case, since the cathode layer 36 has no optical transmissivity and the anode side is formed with a transparent electrode layer 31, then the light emitted from the light emission layer 35 is irradiated externally via the transparent electrode layer 31 and the substrate 30.

Merits of the Embodiment

According to the first embodiment, since a driving circuit substrate 100 and light emission substrate 300 are fabricated by separate processes, the yield rate is improved. Since a manufacturing method is possible wherein, depending on the circumstances, the driving circuit substrate 100 and light emission substrate 300 can be manufactured respectively in separate factories, or by different manufacturers, and then ultimately bonded together, this method is very advantageous in terms of reducing manufacturing costs.

Moreover, according to the first embodiment, the light emitted from the light emission layer 35 is irradiated externally by means of the transparent electrode layer 31 and the substrate 30. In other words, the whole of the substrate 30 is a display face, but since it does not incorporate wires, and the like, which shield the light on the substrate 30 side of the light emission layer 35, it is possible greatly to improve the aperture ratio of the light emission device.

On the other hand, since the structure on the driving circuit substrate 100 side does not contribute to the aperture ratio, circuitry can be disposed across the whole of the picture element regions. Therefore, it is possible to incorporate memory circuits and other types of circuits into the picture element regions, thereby increasing the performance and added value of the display unit. Moreover, since the organic EL is a current driven element, the driving current is also increased, in accordance with increase in the size or fineness of the display unit. In this case, it is necessary to make the wiring thicker in width, but this problem can be resolved readily since the wiring region can be determined freely. Moreover, it is also possible to use a transparent material for the driving circuit substrate.

The pitch between respective picture elements in the light emission device 1000 is determined by the pitch between the light emission layers 35 built into the light emission substrate 30, and the positional accuracy when bonding together the driving circuit substrate 100 and the EL substrate 30 does not affect the picture element pitch in any way. Therefore, even if a manufacturing method based on the bonding process according to the present embodiment is adopted, there is no decline in the accuracy of the picture element pitch in the light emission device 1000.

In this way, according to the manufacturing method of the present embodiment, it is possible to manufacture a light emission device in a highly efficient manner.

Second Embodiment

Figure 8:
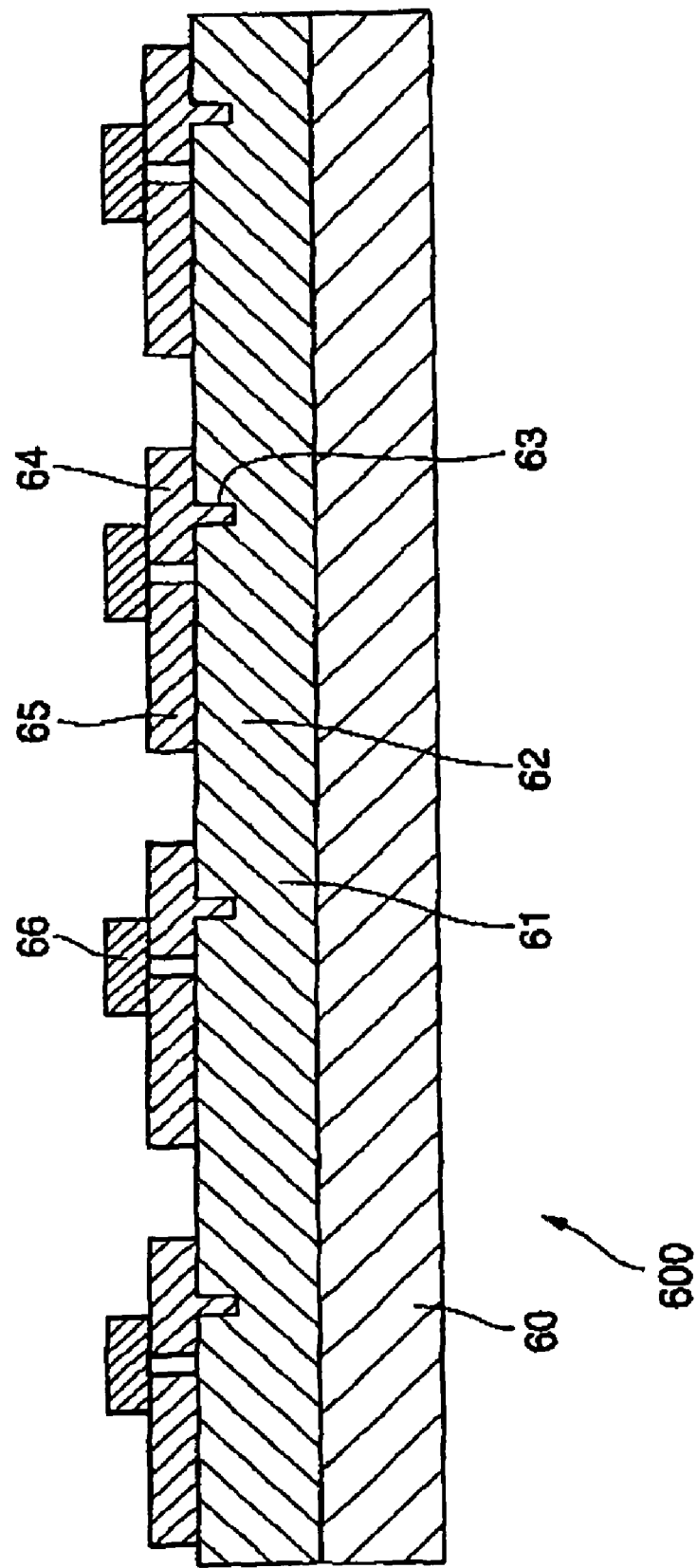
FIG. 8 is a sectional diagram of a light emission substrate in a light emission device relating to a second embodiment of the light emission device according to the present invention, prior to bonding.
Figure 9:
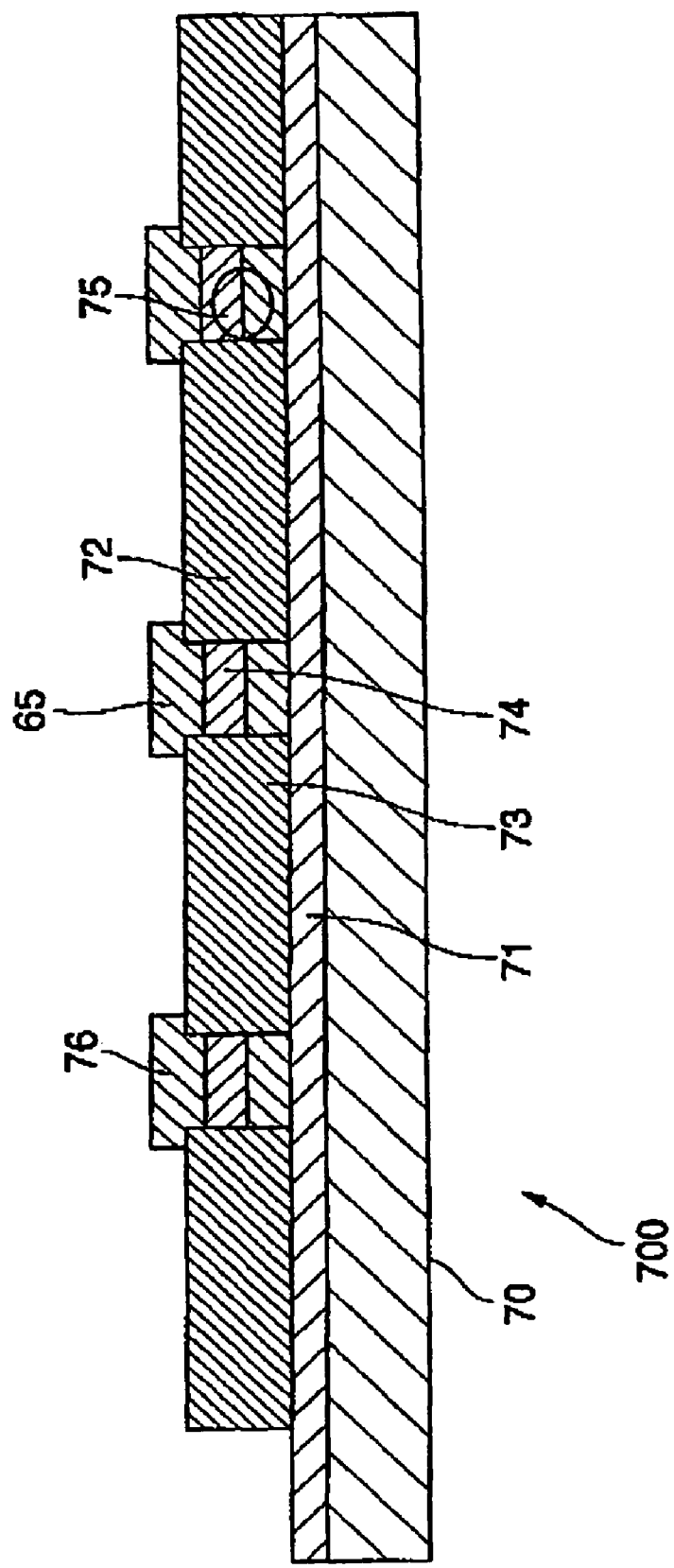
FIG. 9 is a sectional diagram of a driving circuit substrate of a light emission device relating to the second embodiment, prior to bonding.
Figure 10:
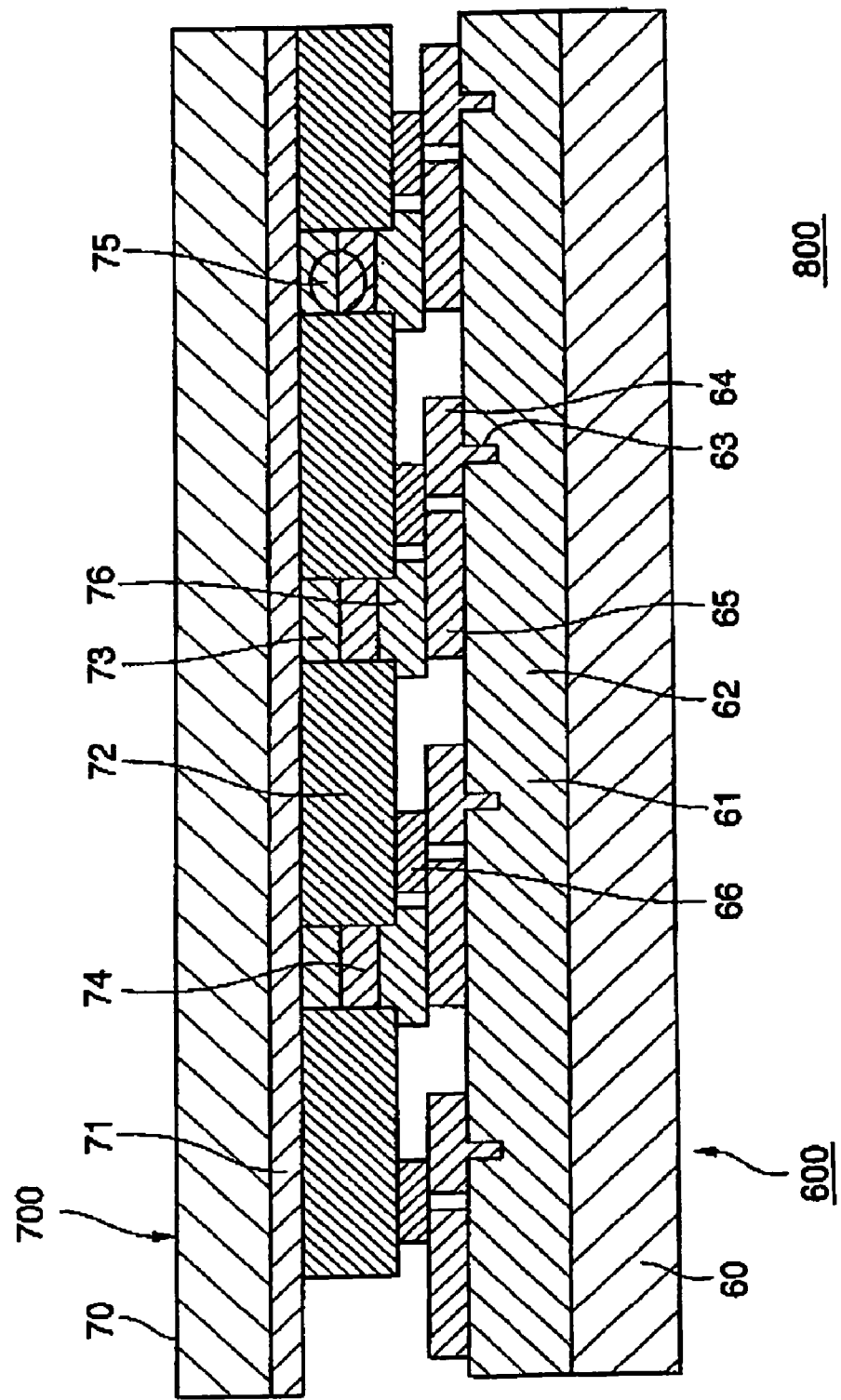
FIG. 10 is a sectional view of a light emission device after bonding.

Below, a second embodiment of the present invention is described with reference to the drawings. FIG. 8 to FIG. 10 illustrate a second embodiment of the present invention. FIG. 8 is a sectional view of a driving circuit substrate 600 prior to bonding, FIG. 9 is a sectional view of a light emission (EL) substrate 700 prior to bonding, and FIG. 10 is a sectional view of a light emission device 800 being an organic EL display unit fabricated by laminating and bonding together the respective substrates described above.

The concrete composition (materials) of the respective layers in the light emission device 800 relating to the present invention are similar to the first embodiment described above, and hence the following description will focus on the points of difference.

As shown in FIG. 8, in the driving circuit substrate 600, wire 61 for scan lines, signal lines, and the like, is formed on the surface of a substrate 60 made from an insulating material, such as synthetic resin, or the like, in positions corresponding to the positions of the picture elements of a light emission device 800 that is to be fabricated subsequently. Moreover, the surface of the wire 61 is covered by a protective thin film 62. A through hole 63 which exposes a portion of the wire 61 is opened in this protective thin film 62, and wire 64 and a picture element 65 are formed in such a manner that they contact with a portion of the wire 61 via the through hole 63. A particular feature of the present embodiment is that the substrate 60 is made from synthetic resin, or the like.

The method of depositing the protective thin film 62, the method of opening the through hole 63, and the method of patterning the wires 61, 64 and the picture element electrode 65, and the like, are similar to those used in the first embodiment. In other words, commonly known film deposition methods and/or photolithography processes can be adopted.

Furthermore, a driving circuit 66 constituted by a thin film transistor, or the like, is provided for each picture element, or each plurality of picture elements, each driving circuit 66 being connected to the wire 64 and the picture element 65. Consequently, the driving circuit is connected to the scan lines, signal lines, and the like 61, and the picture elements 65, of the driving circuit substrate 600.

The materials of each of the aforementioned layers and their method of manufacture are similar to those described in the first embodiment (FIG. 7: S10-S17), and description thereof is omitted here.

On the other hand, as illustrated in FIG. 9, in the light emission substrate 700, a transparent electrode layer 71 is deposited across the whole surface of a base material 70 formed by synthetic resin, or the like. Moreover, a positive hole injection layer 73, organic EL layer 74 and cathode layer 76 are layered, successively, on the transparent electrode layer 71 side, in picture element forming regions which are mutually separated by banks 72 made of insulating material. A light emission layer 75 is constituted by the positive hole injection layer 73 and the organic EL layer 74. A particular characteristic of the present embodiment is that the base material 70 is made from synthetic resin.

Apart from this, the materials forming the transparent electrode layer 71, positive hole injection layer 73, organic EL layer 74, and cathode layer 76, and their method of manufacture, are similar to those of the first embodiment described above (FIG. 7: S20-S24), and hence description thereof is omitted here.

As shown in FIG. 10, the light emission device 800 relating to the present embodiment is constituted by taking a driving circuit substrate 600 as illustrated in FIG. 8 and a light emission substrate 700 as illustrated in FIG. 9, and bonding these substrates together in such a manner that the side on which the picture elements 65 are formed and the side on which the cathode layers 76 are formed are facing inwards. Consequently, when bonding the substrates together, it is necessary to register the driving circuit substrate 600 and the light emission substrate 700 in position, in such a manner that the picture element electrodes 65 and cathode layers 76 become electrically connected. The process for bonding the substrates together is similar to that of the first embodiment described above (FIG. 7: S30). Moreover, similarly to the first embodiment, it is also possible to adopt processes whereby an adhesive is filled in between the substrates, or an inert gas is sealed therebetween, or a vacuum is created therebetween, according to requirements (S7: S31).

Figure 11:
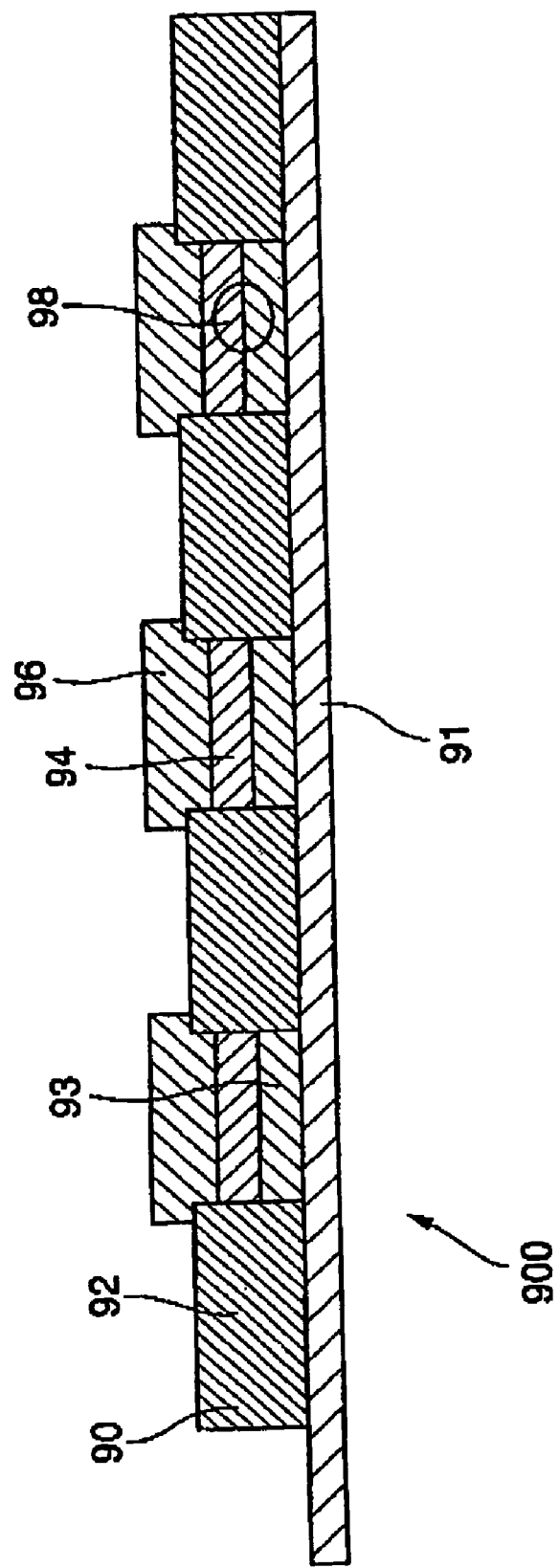
FIG. 11 is a sectional view of a light emission substrate of a light emission device relating to a third embodiment of the light emission device according to the present invention, prior to bonding.

Here, it is also possible to use a light emission substrate 900 having the structure illustrated in FIG. 11, instead of the light emission substrate 700. In this light emission substrate 900, a transparent electrode layer 91 is formed on the whole surface of a base material made form synthetic resin, or the like, and the base material 90 is then etched. The substrate portions left by the etching process will serve as banks 92. A positive hole injection layer 93, organic EL layer 94, and cathode layer 96 are layered successively onto the transparent cathode layer 91, in the picture element forming regions which are mutually separated by the banks 92, and a light emission layer 95 is constituted by the positive hole injection layer 93 and the organic EL layer 94. The materials and composition of each layer are similar to those of the first embodiment described above. In this modification example, the base material 90 is made from a material such as synthetic resin.

Figure 12:
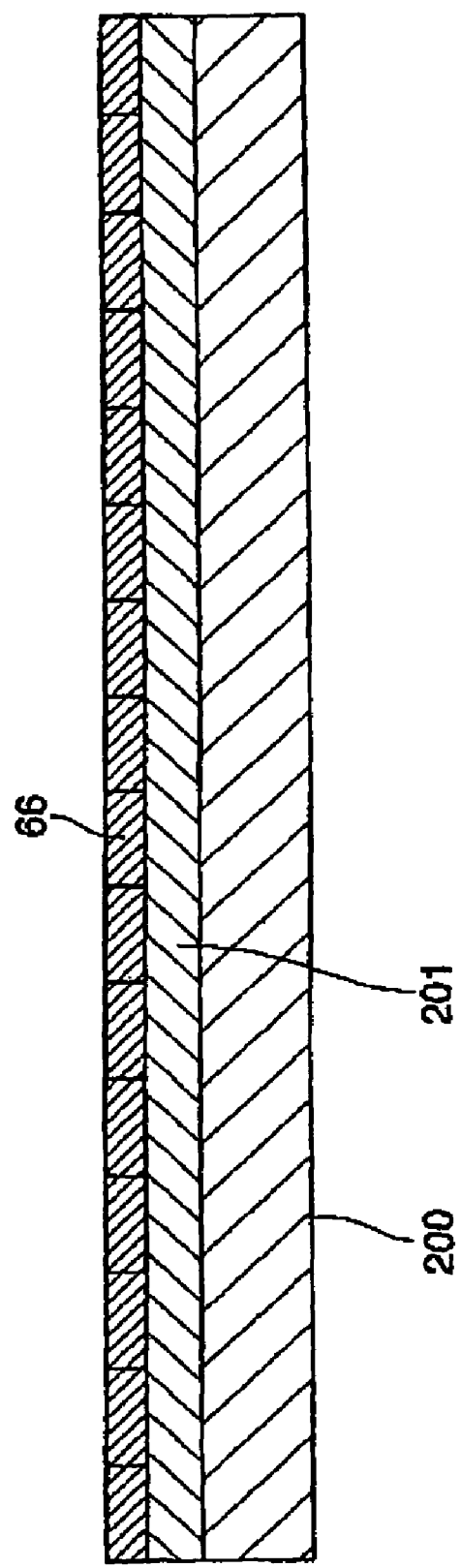
FIG. 12 is a sectional view of a driving circuit constituted by a thin film transistor, prior to transfer to a driving circuit substrate in a light emission device relating to the third embodiment.

Furthermore, the driving circuit substrate 600 may also be manufactured by taking a transparent substrate 200 made from glass, or the like, having the respective driving circuits 66 formed on the surface thereof, as illustrated in FIG. 12, for example, and transferring same to the driving circuit substrate 600 by means of transfer technology. In other words, when this manufacturing method is used, a separating layer 201 of amorphous silicon, or the like, is previously deposited onto a transparent substrate 200 of glass, or the like, which forms the transfer source substrate, as illustrated in FIG. 12, and driving circuits 66 constituted by thin film transistors are deposited thereon, thereby forming a plurality of transfer objects. This transparent substrate 200 and the driving circuit substrate 600 are mutually aligned and the thin film transistors in question are transferred to the driving circuit substrate 600, which is the transfer destination, by applying energy (irradiating light from the rear side) at each region of a driving circuit 66, in the partial regions of the transparent substrate 200 corresponding to the thin film transistors that are to be transferred.

According to this second embodiment, in addition to displaying the same benefits as those of the first embodiment, a particular characteristic is obtained in that synthetic resin, or the like, is used for both the base material 60 of the driving circuit substrate 600 and the base material 70 of the light emission substrate 700. A plastic film made from synthetic resin of this kind has high expandability when heat is applied thereto, and it was considered to be unusable in the methods according to the prior art due to the difficulty of aligning masks when forming the organic EL layer. However, in the present invention, the pitch between the picture elements of the light emission device 800 is determined by the pitch of the light emission layer 75 built into the substrate 70, and hence the positional accuracy achieved when layering together the base material 60 of the driving circuit substrate 600 and the base material 70 of the light emission substrate 700 has no effect at all on the pitch of the picture elements. In other words, it is not necessary to use a substrate of glass, or the like, of increased weight and low thermal expansivity, in order to perform positional alignment at a very fine pitch between the two substrates. Therefore, it is possible to use a substrate of synthetic resin, or the like, as in the present embodiment, and hence an inexpensive substrate material can be selected freely.

In this way, according to the method of manufacture according to the present embodiment, it is possible to manufacture a light emission device 800 in a highly efficient manner, and as a result, a large and flexible display unit can be fabricated.

Moreover, according to this second embodiment, since it is possible to laminate a plurality of thin film transistors 66, which are to be disposed at intervals on the driving circuit substrate 600, collectively on a transparent substrate 200, at the same time, then the amount of material used in manufacturing the thin film transistors can be comparatively reduced, the surface area efficiency can be significantly increased, and a driving circuit substrate in which the circuitry and elements of a plurality of thin film transistors, or the like, are disposed in a dispersed fashion, can be manufactured efficiently and inexpensively.

Moreover, according to this second embodiment, it is possible to implement a method whereby a plurality of thin film transistors fabricated collectively on a transparent substrate 200 are categorized and rejected where necessary, prior to transfer, and consequently, product yield can be improved.

Third Embodiment

The third embodiment of the present invention is described with respect to a number of examples of electronic devices comprising the aforementioned EL element driving circuit, and organic EL display panel, which is an electro-optical device constituted so as to allow active matrix driving of a light emission device driven by the aforementioned driving circuit.

(1: Mobile Computer)

Figure 13:
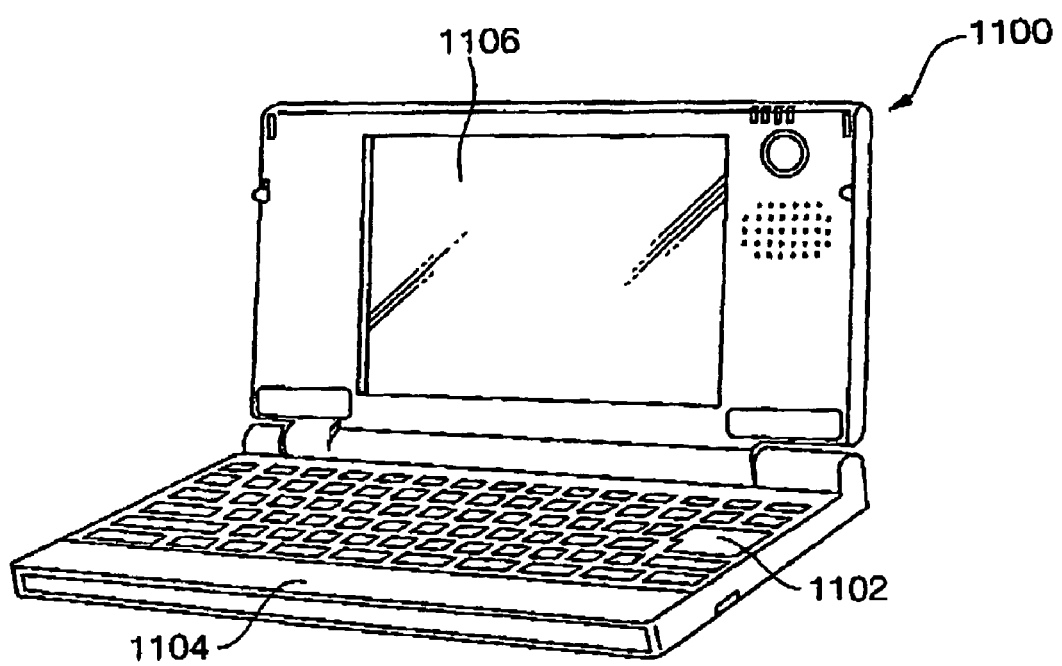
FIG. 13 is an oblique view showing the composition of a personal computer, which is one example of an electronic device relating to the present invention.

Firstly, an example wherein an organic EL display panel relating to the third embodiment is applied to a mobile type personal computer will be described. FIG. 13 is an oblique view showing the composition of this personal computer. In FIG. 13, the personal computer 1100 is constituted by a main unit 1104 equipped with a keyboard 1102, and a display unit 1106. The display unit 1106 comprises an organic EL display panel 1101.

(2: Portable Telephone)

Figure 14:
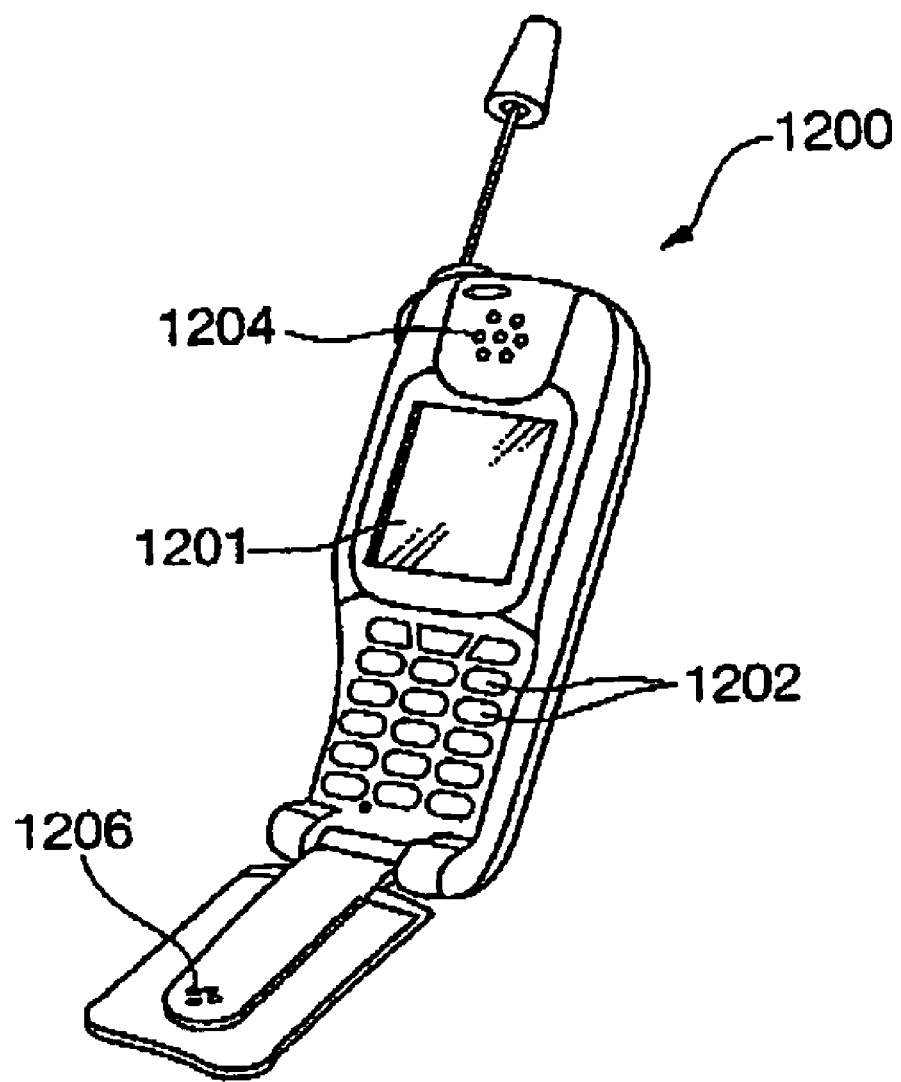
FIG. 14 is an oblique view showing the composition of a portable telephone, which is one example of an electronic device relating to the present invention.

Next, an example wherein an organic EL display panel is applied to the display section of a portable telephone is described. FIG. 14 is an oblique view showing the composition of this portable telephone. In FIG. 14, the portable telephone 1200 comprises a plurality of operating buttons 1202, a receiving aperture 1204, a transmitting aperture 1206, and the aforementioned organic EL display panel 1201.

(3: Digital Still Camera)

Figure 15:
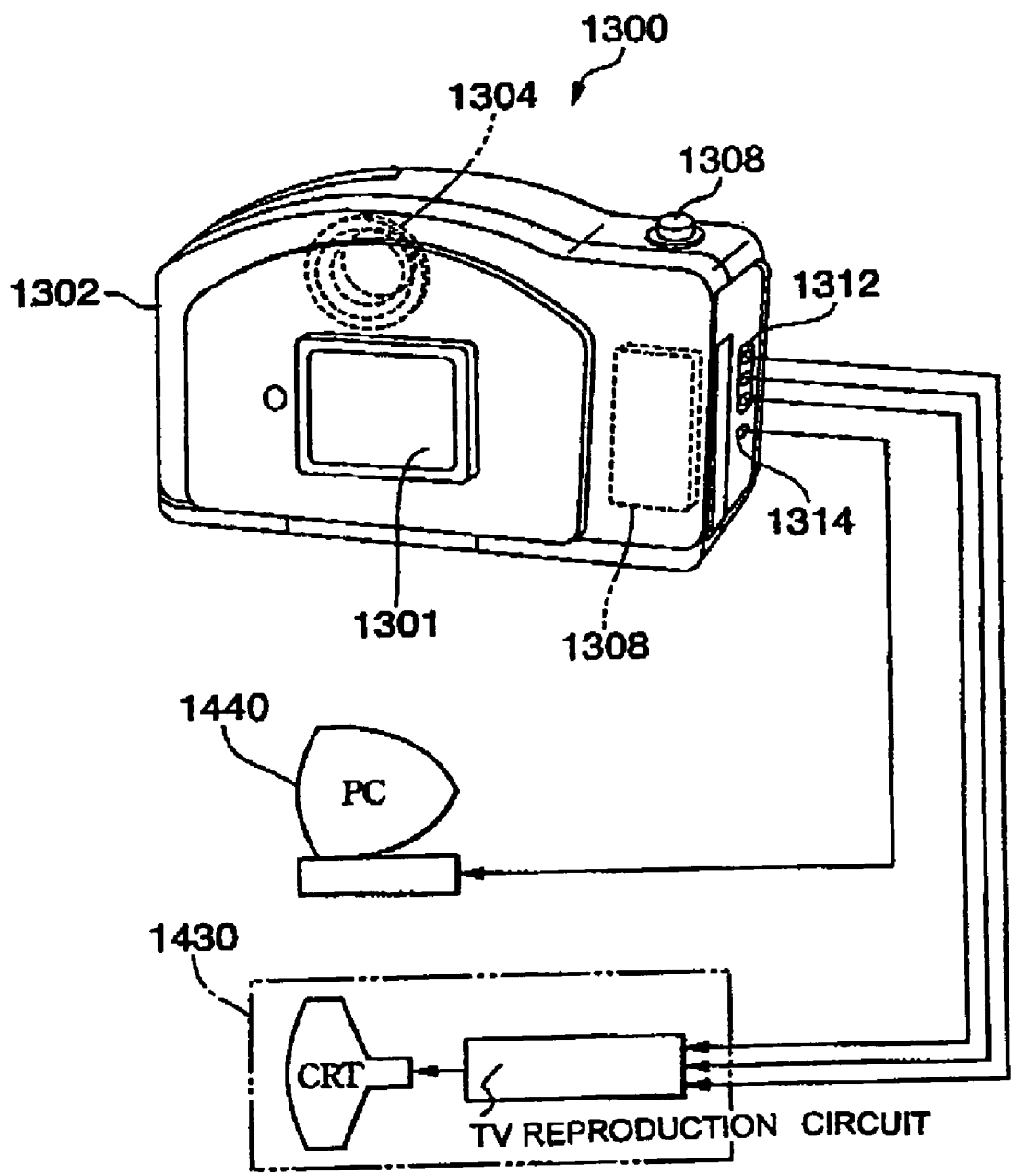
FIG. 15 is an oblique view showing the composition of the rear face side of a digital still camera, which is one example of an electronic device relating to the present invention.
Figure 16:
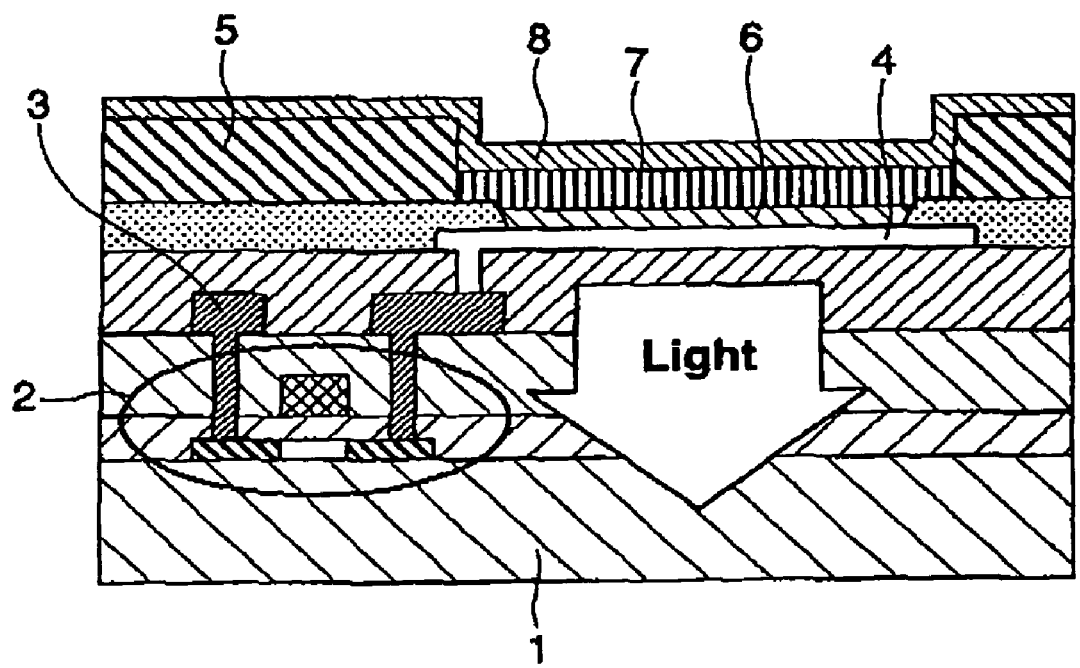
FIG. 16 is a sectional view showing the structure of an organic EL display unit according to the prior art.
Figure 17:
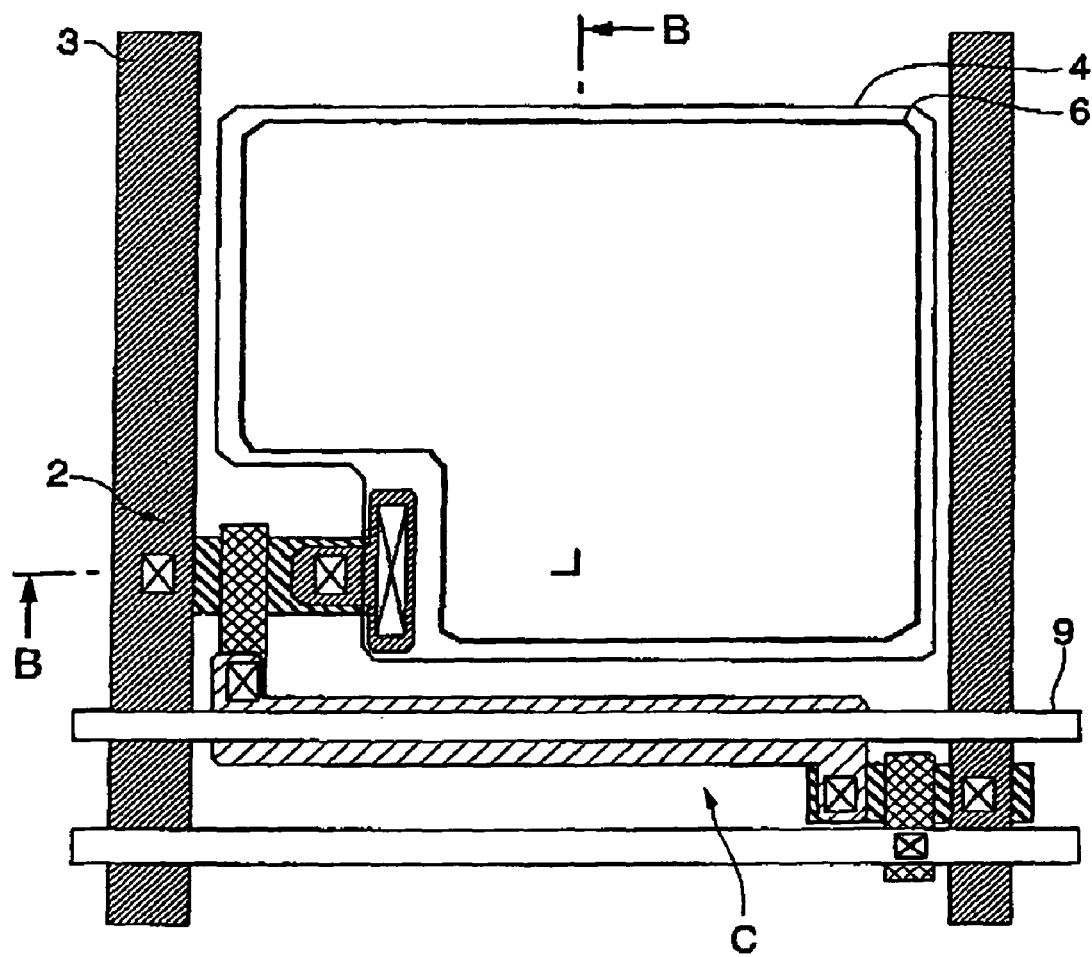
FIG. 17 is a plan view showing the structure of an organic EL display unit according to the prior art.

Furthermore, a digital still camera is described wherein an organic EL display panel is used in the finder. FIG. 15 is an oblique diagram showing the composition of this digital still camera, but this is a simplified illustration with respect to connections to external devices.

A normal camera exposes a film to light by means of an optical image of a subject, whereas a digital still camera 1300 generates a photographic signal by converting an optical image of a subject electro-optically, by means of an imaging element, such as a CCD (Charge Coupled Device), or the like. Here, the aforementioned organic EL display panel 1301 is provided on the rear face of the case 1302 of the digital still camera 1300, images being displayed on the basis of the imaging signal from the CDD. Therefore, the organic EL display panel 1301 functions as a finder for displaying the subject. Moreover, a photoreceptor unit 1304 comprising an optical lens, CDD, and the like, is provided on the observer side (the rear side in FIG. 15) of the case 1302.

Here, the user checks the image of the subject displayed on the organic EL display panel 1301, and when he or she presses the shutter release button 1306, the photographic signal from the CDD at that time is transferred and stored in a memory of the circuit board 1308. Furthermore, the display still camera 1300 is also provided with a video signal output terminal 1312, and a data communications input/output terminal 1314, on the side of the case 1302. As illustrated in FIG. 15, a television monitor 1430 can be connected to the video signal output terminal 1312, and a personal computer 1440 can be connected to the data communications input/output terminal 1314, according to requirements. Moreover, the photographic signal stored in the memory of the circuit board 1308 can be output to the television monitor or the personal computer 1440, by means of prescribed operations.

Other examples of electronic devices, in addition to the personal computer in FIG. 13, the portable telephone in FIG. 14, and the digital still camera in FIG. 15, include: a liquid crystal television, a viewfinder type or direct monitor view type video tape recorder, a car navigation unit, a pager, an electronic notebook, a calculator, a word processor, a work station, a television telephone, a POS terminal, a device equipped with a touch panels, and the like. Needless to say, the aforementioned display device can be used for the display unit in each of these various types of electronic devices.

INDUSTRIAL APPLICABILITY

As described above, according to the present invention, a light emission device is manufactured by bonding together a driving circuit substrate on which a driving circuit is disposed and a light emission substrate on which light emission layers, and the like, are formed, and hence a merit is obtained in that the light emission device can be manufactured in a highly efficient manner.

In particular, according to the present invention, it is possible to manufacture a large and flexible display unit.

The invention claimed is:

1. A light emission device having a first base comprising a transistor and a second base having an optically transmissive substrate and an organic EL element formed at the substrate, the organic EL element comprising a cathode, an anode, and an organic EL layer including a light emission layer positioned between the anode and the cathode, and the first base and the second base being bonded to electrically connect the transistor and the cathode, the light emission device comprising:

a first insulating film covering the transistor;
   a first electrode connected to the transistor via a first through hole formed at the first insulating film;
   a second insulating film covering the first electrode;
   a second electrode connected to the first electrode via a second through hole formed at the second insulating film,
   by connecting the second electrode and the cathode, the cathode and the transistor being electrically connected; and
   banks positioned at the second base, the light emission layer being positioned between the banks and the cathode being formed so as to cover from the light emission layer to end portions of the banks, wherein
   a light emitted from the light emission layer of the organic EL element is emitted via the optically transmissive anode and the second base.

2. The light emission device according to claim 1, further comprising sealing means for preventing oxidation of the cathode being between the first base and the second base, in at least a part where the second electrode and the cathode are not connected.

3. The light emission device according to claim 2, the sealing means being an adhesive positioned at least between the second insulating film and the cathode.

4. The light emission device according to claim 2, the sealing means being an adhesive positioned at least between the second insulating film and the cathode.

5. The light emission device according to claim 2, the sealing means being an inert gas sealed in a gap at least between the second insulating film and the cathode.

6. The light emission device according to claim 2, the sealing means being an inert gas sealed in a gap at least between the second insulating film and the cathode.

7. The light emission device according to claim 1, the organic EL layer comprising at least a hole injection layer formed on the anode side, and the light emission layer being formed on the hole injection layer.

8. The light emission device according to claim 2, the organic EL layer comprising at least a hole injection layer formed on the anode side, and the light emission layer being formed on the hole injection layer.

9. An electro-optical device comprising the light emission device according to claim 1.

10. An electro-optical device comprising the light emission device according to claim 2.

11. An electronic appliance comprising the light emission device according to claim 1.

12. An electronic appliance comprising the light emission device according to claim 2.

* * * * *